(12) United States Patent
Kang

(10) Patent No.: US 7,998,837 B2
(45) Date of Patent: Aug. 16, 2011

(54) METHOD FOR FABRICATING SEMICONDUCTOR DEVICE USING SPACER PATTERNING TECHNIQUE

(75) Inventor: Chun Soo Kang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/821,285

(22) Filed: Jun. 23, 2010

(65) Prior Publication Data

US 2011/0159663 A1 Jun. 30, 2011

(30) Foreign Application Priority Data

Dec. 29, 2009 (KR) .................. 10-2009-0133241

(51) Int. Cl.
*H01L 21/00* (2006.01)
*H01L 21/31* (2006.01)
*H01L 21/469* (2006.01)

(52) U.S. Cl. ............... 438/460; 438/738; 257/E21.483

(58) Field of Classification Search .............. 438/460, 438/738; 257/E21.483
See application file for complete search history.

(56) References Cited

U.S. PATENT DOCUMENTS

| 5,698,902 A | 12/1997 | Uehara et al. | |
|---|---|---|---|
| 6,221,777 B1 * | 4/2001 | Singh et al. | 438/692 |
| 7,737,001 B2 * | 6/2010 | Abe et al. | 438/462 |
| 2005/0176197 A1 | 8/2005 | Weis et al. | |

* cited by examiner

*Primary Examiner* — Alexander G Ghyka
*Assistant Examiner* — Seahvosh J Nikmanesh
(74) *Attorney, Agent, or Firm* — Ladas & Parry LLP

(57) ABSTRACT

A method for fabricating a semiconductor device using optical proximity correction to form high integrated cell patterns that are less prone to bridge defects. The method includes: obtaining a target layout of cell patterns, which form rows in a cell region, and peripheral patterns of a peripheral region; forming oblique patterns, which are alternately overlapped in the rows of the cell patterns, and a reverse pattern of the peripheral patterns; attaching spacers to sidewalls of the oblique patterns and the reverse pattern; forming first burying patterns between the oblique patterns and a second burying pattern around the reverse pattern by filling gaps between the spacers; and forming the cell patterns by cutting and dividing the middle portions of the oblique patterns and the first burying patterns, and setting the peripheral pattern with the second burying pattern by removing the reverse pattern.

37 Claims, 20 Drawing Sheets

FIG. 1 (PRIOR ART)
(a)
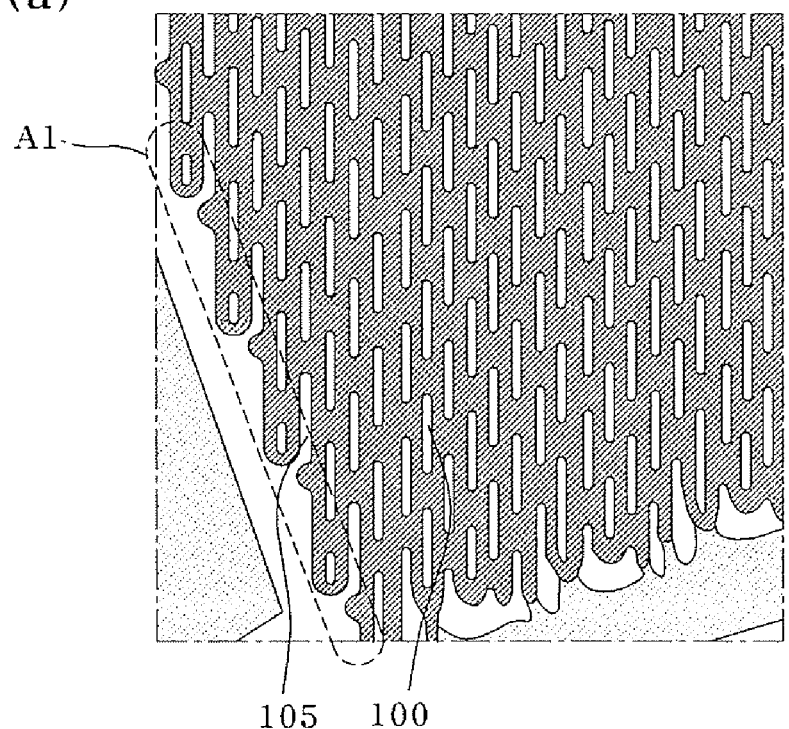
(b)
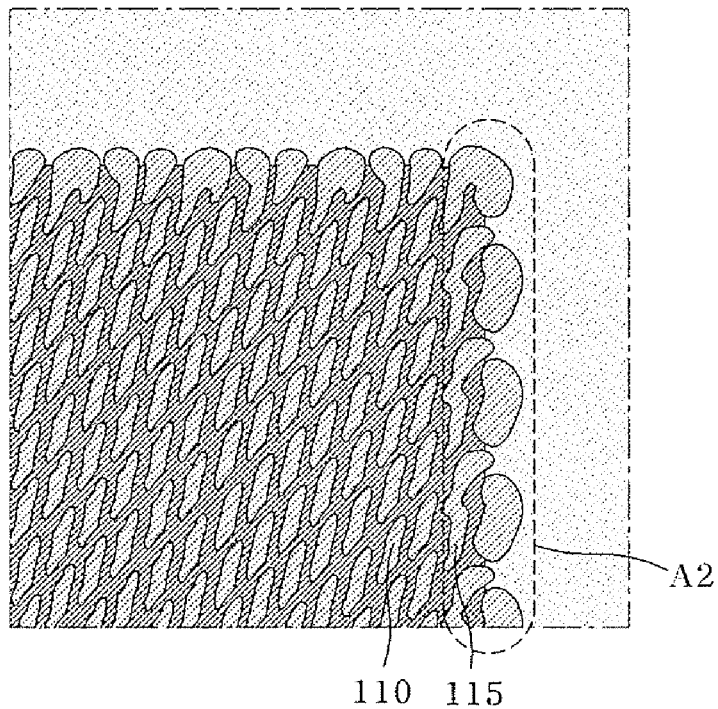

FIG. 2 (PRIOR ART)

| (0,2) | Mat Edge | Mat Center | CD Mat Edge | CD Mat Center |
|---|---|---|---|---|
| 4 | 26.3 | 20.4 | 22.6 | 22.0 |
| 5 | 22.6 | 21.6 | 20.8 | 20.1 |
| 6 | 26.7 | 22.6 | 25.0 | 22.5 |
| 7 | 16.8 | 22.5 | 19.6 | 23.5 |
| 8 | 28.4 | 24.1 | 21.0 | 21.3 |
| 9 | 21.1 | 21.3 | 19.8 | 23.3 |
| 10 | 23.6 | 21.7 | 21.5 | 21.4 |
| 11 | 17.9 | 21.1 | 19.4 | 21.0 |
| 12 | 26.6 | 23.9 | 24.7 | 21.0 |
| 13 | 19.0 | 18.5 | 19.2 | 23.2 |
| 14 | 27.7 | 21.4 | 23.0 | 23.0 |
| 15 | 18.3 | 22.7 | 19.7 | 21.3 |
| 16 | 25.1 | 21.3 | 20.0 | 23.0 |
| 17 | 20.7 | 21.3 | 20.2 | 21.5 |
| 18 | 24.0 | 20.1 | 24.8 | 20.0 |
| 19 | 19.2 | 21.4 | 19.8 | 23.5 |
| 20 | 25.8 | 21.8 | 21.5 | 20.1 |
| 21 | 21.0 | 21.9 | 20.2 | 21.4 |
| 22 | 21.2 | 24.8 | 23.5 | 22.0 |
| 23 | 18.2 | 21.9 | 19.0 | 25.2 |
| 24 | 25.8 | 25.5 | 20.0 | 20.8 |
| Ave | 22.66 | 21.99 | 21.20 | 21.96 |
| 3σ | 10.89 | 4.78 | 5.86 | 4.05 |
| max | 28.4 | 25.5 | 25.0 | 25.2 |
| min | 16.8 | 18.5 | 19.0 | 20.0 |

METHOD FOR FABRICATING SEMICONDUCTOR DEVICE USING SPACER PATTERNING TECHNIQUE

CROSS-REFERENCES TO RELATED APPLICATIONS

The present application claims priority under 35 U.S.C 119(a) to Korean application number 10-2009-0133241, filed on Dec. 29, 2009, in the Korean intellectual property Office, which is incorporated herein by reference in its entirety set forth in full.

BACKGROUND

Exemplary embodiments of the present invention relate to fabrication of a semiconductor device, and more particularly, to a method for fabricating a semiconductor device using a spacer patterning technique.

As the demand for high capacity semiconductor memory devices has continually increased, much attention has been paid to increasing the integration density of these semiconductor memory devices. In order to increase the integration density of semiconductor memory devices, a number of different approaches have been made to form a plurality of memory cells on a single wafer by reducing the chip size and/or changing the cell structure. With regards to methods for increasing integration density by changing the cell structure, attempts have been made to reduce a cell area by changing the planar arrangement of active regions or changing the cell layout. One of these approaches has been to change the layout of the active region from an $8F^2$ layout to a $6F^2$ layout. A device having a $6F^2$ layout may be defined as a semiconductor device having a unit cell which has a bit line length direction of 3F and a word line length direction of 2F, so that its area is $6F^2$. A DRAM having a $6F^2$ layout has an active region which is obliquely disposed, and two unit cells that are disposed within one active region. When compared with a DRAM having an $8F^2$ layout, the DRAM having a $6F^2$ layout has a higher integration density in that two storage node contact plugs are disposed between bit lines and the storage node contact plugs pass through a bit line contact within the active region. However, although the $6F^2$ layout reduces the chip size and thus increases the productivity, the adjacent active regions become very close to each other. As the active regions become closer, the optical proximity effect (OPE) can greatly influence the exposure process. Therefore, there is a growing need for performing an optical proximity correction (OPC) in order to form patterns that have the desired shape.

With the need for performing OPC, it becomes more difficult to perform a single exposure process even in an immersion exposure apparatus during a device isolation process of a DRAM having a sub-40 nm $6F^2$ layout, because a pitch between device isolation regions is less than a pitch of an $8F^2$ layout. Hence, a spacer patterning technique (SPT) is applied. The spacer patterning technique is performed using a positive method or a negative method. Since the negative method can reduce a mask process by one step, in which it is greatly advantageous in view of the process simplification. However, in the spacer patterning technique according to the negative method, a critical dimension (CD) of a partition directly influences a CD of an active region. Specifically, in a partition forming process applied in a current spacer patterning technique, a partition mask is applied to only a cell mat region where an active region will be formed, and a partition mask is not applied to regions other than the cell mat region, for example, a core region and a peripheral region. Accordingly, patterns are formed in the cell region in the partition forming process, whereas no patterns are formed in the core region and the peripheral region. Patterns are formed in the core region and the peripheral region when a cutting mask is applied.

In this case, the partition CD itself is transferred on the active region in a cell block edge region, which is an edge region of the cell mat region, and directly influences the CD uniformity even when a slight error exists in the OPC process. Therefore, a defect may occur in the CD uniformity, or a defect such as a pattern thinning or bridge may occur. As illustrated in FIG. 1 which shows the cell block edge region formed by a negative method (a) and a positive method (b) in the spacer patterning technique, a bridge defect was found in cell block edge regions A1 and A2.

Referring to FIG. 1, patterns 100 and 110 in the center region of the cell mat are normally formed, whereas adjacent patterns are coupled together in the cell block edge regions A1 and A2 which are edge regions of the cell mat. That is, bridge defects 105 and 115 can occur in the cell block edge regions A1 and A2. Defects such as bridges in the cell block edge regions occur due to a large mask CD difference in each region, an influence of an OPC, or a different open ratio in the partition mask. Since fabrication of the mask includes an exposure process that uses an E-beam, then an optical proximity effect can occur. This can result in causing a different mask CD in the cell block edge region. When the optical proximity effect and the different mask CD become greater in a direction of the cell edge region rather than the cell center region, a local CD uniformity is degraded, and the bridge defects 105 and 115 can occur as illustrated in FIG. 1.

As shown in Table of FIG. 2, when the partition mask is applied to only the cell mat region, the entire wafer CD uniformity in the average cell block edge region (10.89 nm) is about two times larger that of the standard deviation ($3\sigma$) of that of the average center region (4.78 nm) in the cell mat region. This is because the mask CD of the cell block edge region changes due to the influence of the optical proximity effect brought about by the exposure process using E-beam in the fabrication of the mask. Due to the change of the mask CD, a local CD uniformity characteristic is degraded in a direction of the cell block edge region. Also, in the partition mask, an opening exists in the cell mat region, but the remaining regions are blocked. Thus, the open ratio is different in each region. Due to the different open ratio in each region, a CD difference is caused by flare noise that can occur during the exposure process. Consequently, a CD uniformity characteristic may be degraded, and as a result bridge defects may arise in the cell edge region.

Furthermore, since the patterns are formed in only the cell mat region in the partition process and no patterns are formed in the remaining regions, a pattern density of the cell mat region is different from a pattern density of the remaining regions. If deposition, etching and planarization processes subsequent to the partition mask are performed so that the pattern densities in the respective regions are different from one another, then the respective regions have different bias values and profiles. Thus the uniformity is influenced which can degrade the CD uniformity of the active region. A resolution enhancement lithography assisted by chemical shrink (RELACS) process is used in a cutting mask on the core region and the peripheral region. Consequently, in the case of a minimum line pattern, since a CD must be set smaller by an RELACS bias, it is difficult to ensure a satisfactory process margin.

SUMMARY

An embodiment of the present invention relates to a method which is capable of improving a CD uniformity and a process margin in a spacer patterning technique for use in implementing an active region of a DRAM having a $6F^2$ layout. Also, another embodiment of the present invention relates to a method which is capable of improving a process margin of patterns in a core and peripheral regions, as well as, in cell block edge regions, thereby substantially preventing degradation of CD uniformity, which is caused by an OPC process, a mask CD, and/or an exposure ratio.

Furthermore, another embodiment of the present invention relates to a method which is capable of improving an entire wafer CD uniformity by controlling a loading effect which can occur in a deposition process, a planarization process, and/or an etching process.

In one embodiment, a method for fabricating a semiconductor device includes: obtaining a target layout of cell patterns, which form rows in a cell region, and peripheral patterns of a peripheral region; forming oblique patterns, which are alternately overlapped in the rows of the cell patterns, and a reverse pattern of the peripheral patterns; attaching spacers to sidewalls of the oblique patterns and the reverse pattern; forming first burying patterns between the oblique patterns and a second burying pattern around the reverse pattern by filling gaps between the spacers; and forming the cell patterns by cutting and dividing the middle portions of the oblique patterns and the first burying patterns, and setting the peripheral pattern with the second burying pattern by removing the reverse pattern.

The cell patterns may be arranged along a $6F^2$ or a $4F^2$ cell layout in an oblique direction.

The forming of the reverse pattern may include: obtaining a reverse layout of the target layout of the peripheral pattern; and reducing the size of the reverse layout. The size of the reverse layout may be reduced by the width of the spacer or more than the width of the spacer.

The oblique patterns, the reverse pattern, the first burying pattern, and the second burying pattern may be formed of substantially the same material or formed of different materials.

In another embodiment, a method for fabricating a semiconductor device includes: forming a hard mask film and a partition layer over a wafer where a cell region and a peripheral region are defined; patterning the partition layer to form oblique patterns, which are alternately overlapped with rows of cell patterns disposed in the cell region, and a reverse pattern of peripheral patterns which are to be disposed in the peripheral region; attaching spacers to sidewalls of the oblique patterns and the reverse pattern; forming first burying patterns between the oblique patterns and a second burying pattern around the reverse pattern by filling gaps between the spacers; forming the cell patterns by cutting and dividing the middle portions of the oblique patterns and the first burying patterns, and setting the peripheral pattern with the second burying pattern by removing the reverse pattern; selectively removing the spacers; and forming a hard mask pattern by selectively etching an exposed region of the hard mask film by using the cell patterns and the peripheral pattern as an etching mask.

A gap of the reverse pattern may be formed at a location which is spaced apart by a space of the peripheral pattern.

The forming of the first burying patterns and the second burying pattern may include: burying the oblique patterns, the reverse pattern, and the spacer with a burying layer after the process of attaching the spacers; and performing a planarization process on the burying layer to expose top surfaces of the oblique patterns, the reverse pattern, and the spacer. The planarization process may be performed by a chemical mechanical polishing (CMP) process or by an etch-back process.

After forming the hard mask pattern, the method may further include: forming a device isolation trench having a first width in the cell region by etching the wafer of the cell region and the peripheral region by using the hard mask pattern as an etching mask; and forming a device isolation trench having a second width in the peripheral region, the second width being greater than the first width.

The forming of the oblique patterns and the peripheral pattern may include: forming a resist film over the partition layer after the process of forming the partition layer; obtaining a target layout of cell patterns, which form rows in the cell region, and peripheral patterns, which are to be disposed in the peripheral region; obtaining a reverse layout of a target layout of the cell patterns and the peripheral pattern; reducing the size of the reverse layout; transferring the reverse layout onto the resist film; and patterning the partition layer by using the resist film onto which the reverse layout is transferred.

An etching loading effect of the peripheral region may be reduced in the process of forming the reverse pattern and the process of removing the reverse pattern.

The hard mask layer may include a single film or a stacked film selected from the group consisting of a PETEOS (Plasma Enhanced Tetraethylorthosilicate) film, an amorphous carbon film, a nitride film, and an oxide film.

The setting of the cell pattern and the peripheral patterns may include: forming a resist film over the first burying patterns and the second burying patter after the process of forming the first burying patterns and the second burying pattern; disposing a cutting mask over the resist film, the cutting mask including holes, which expose the middle portions of the oblique patterns and the first burying patterns, and an open portion, which exposes the reverse pattern; forming a resist pattern by transferring the holes and the open portion of the cutting mask onto the resist film; and selectively etching and removing exposed regions of the resist pattern. The open portion of the resist pattern may expose an entire region of the reverse pattern, and expose a half region of the spacer.

According to another embodiment, a method for fabricating a semiconductor device includes: obtaining a target layout of cell patterns which are formed along a row in a cell region and peripheral patterns of a peripheral region; forming oblique patterns, which are alternately overlapped in rows of the cell patterns and extend on a border region between the cell region and the peripheral region, and a reverse pattern of the peripheral patterns; attaching spacers to sidewalls of the oblique patterns and the reverse pattern; forming first burying patterns between the oblique patterns and a second burying pattern around the reverse pattern by filling gaps between the spacers; and forming the cell patterns by cutting and dividing the middle portions of the oblique patterns and the first burying patterns, and setting the peripheral pattern with the second burying pattern by removing the reverse pattern.

According to another embodiment, a method for fabricating a semiconductor device includes: forming a hard mask film and a partition layer over a wafer where a cell region and a peripheral region are defined; forming oblique patterns, which are alternately overlapped with rows of cell patterns to be disposed in the cell region, and a reverse pattern of peripheral patterns, which are to be disposed in the peripheral region, over the partition layer; attaching spacers to sidewalls of the oblique patterns and the reverse pattern; forming first burying patterns between the oblique patterns and a second burying pattern around the reverse pattern by filling gaps between the spacers; forming the cell patterns by cutting and dividing the middle portions of the oblique patterns and the first burying patterns, and setting the peripheral pattern with the second burying pattern by removing the overlapped region on the border region of the oblique patterns and the reverse pattern; selectively removing the spacers; and forming a hard mask pattern by selectively etching an exposed region of the hard mask film by using the cell patterns and the peripheral pattern as an etching mask.

BRIEF DESCRIPTION OF THE DRAWINGS

The above and other aspects, features and other advantages will be more clearly understood from the following detailed description taken in conjunction with the accompanying drawings, in which:

FIG. 1 is a SEM image showing a cell block edge region which is formed using a typical spacer patterning technique;

FIG. 2 is a table showing the CD uniformity of a wafer which is formed using a typical spacer patterning technique;

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of the invention.

Although an embodiment of the present invention is applied to a process of forming a device isolation trench of a DRAM semiconductor device having a $6F^2$ or a $4F^2$ layout, it may also be modified to a process of forming a pattern having a shape other than the device isolation trench when a process of transferring a pattern through an exposure process is included.

Figure 3:
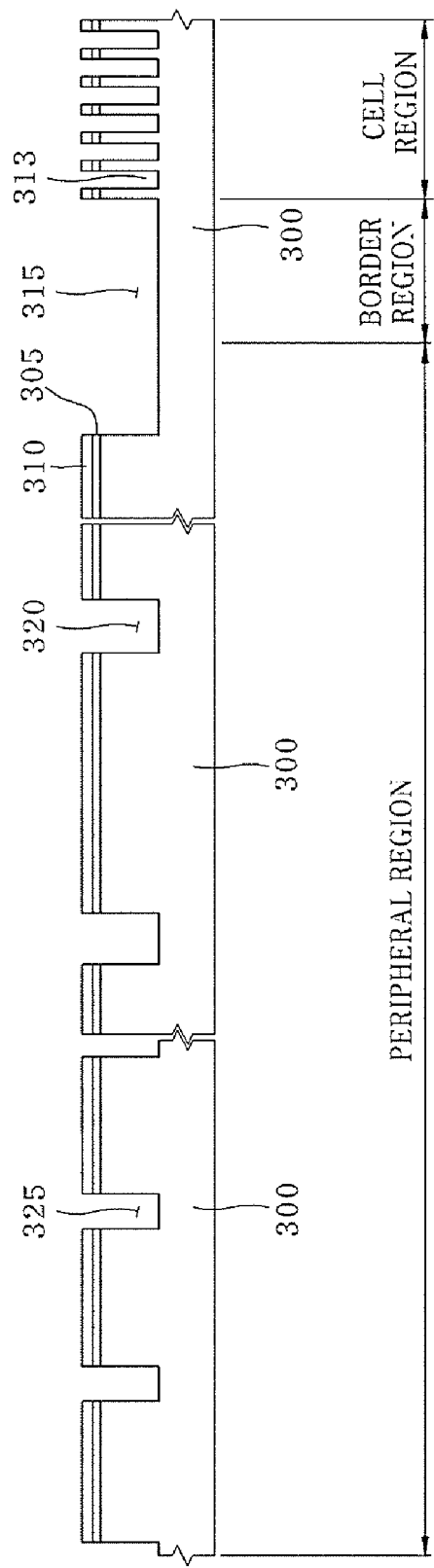
FIG. 3 is a view illustrating a device isolation trench which is formed using a spacer patterning technique according to an embodiment of the present invention.

FIG. 3 is a sectional view illustrating a device isolation trench formed using a spacer patterning technique according to an embodiment of the present invention.

Referring to FIG. 3, in order to integrate a pattern on a wafer, a memory cell such as a DRAM defines an active region bound within a device isolation film which is implemented by forming a device isolation trench within the wafer and filling the device isolation trench with an insulating material. The device isolation film functions to enhance the yield of the device by controlling data retention time of the DRAM. In order to make such a device isolation film, a mask pattern including a pad oxide pattern 305 and a pad nitride pattern 310 where a device isolation trench shape is transferred is formed on a wafer in a cell region and a peripheral region, and device isolation trenches 313, 315, 320 and 325 are formed within each region of the wafer by an etching process using the mask pattern as an etching mask. Meanwhile, as the integration density of the semiconductor device increases, a spacer patterning technique (SPT) is introduced and applied as a method of forming a fine device isolation trench.

When the device isolation trenches are formed using the spacer patterning technique, patterns are normally formed in the cell center region. However, CD uniformity is prone to being degraded in a cell block edge region which is a cell edge region and thus patterns are prone to becoming thin or bridge defects may occur.

Such defects are caused by a mask CD difference and a pattern density difference among the cell region, the cell block edge region, and the peripheral region. Therefore, the embodiment of the present invention is directed to provide a method of improving a pattern density difference and a mask CD difference among the cell region, the cell block edge region, and the peripheral region when a device isolation trench is formed using a spacer patterning process.

Figure 4:
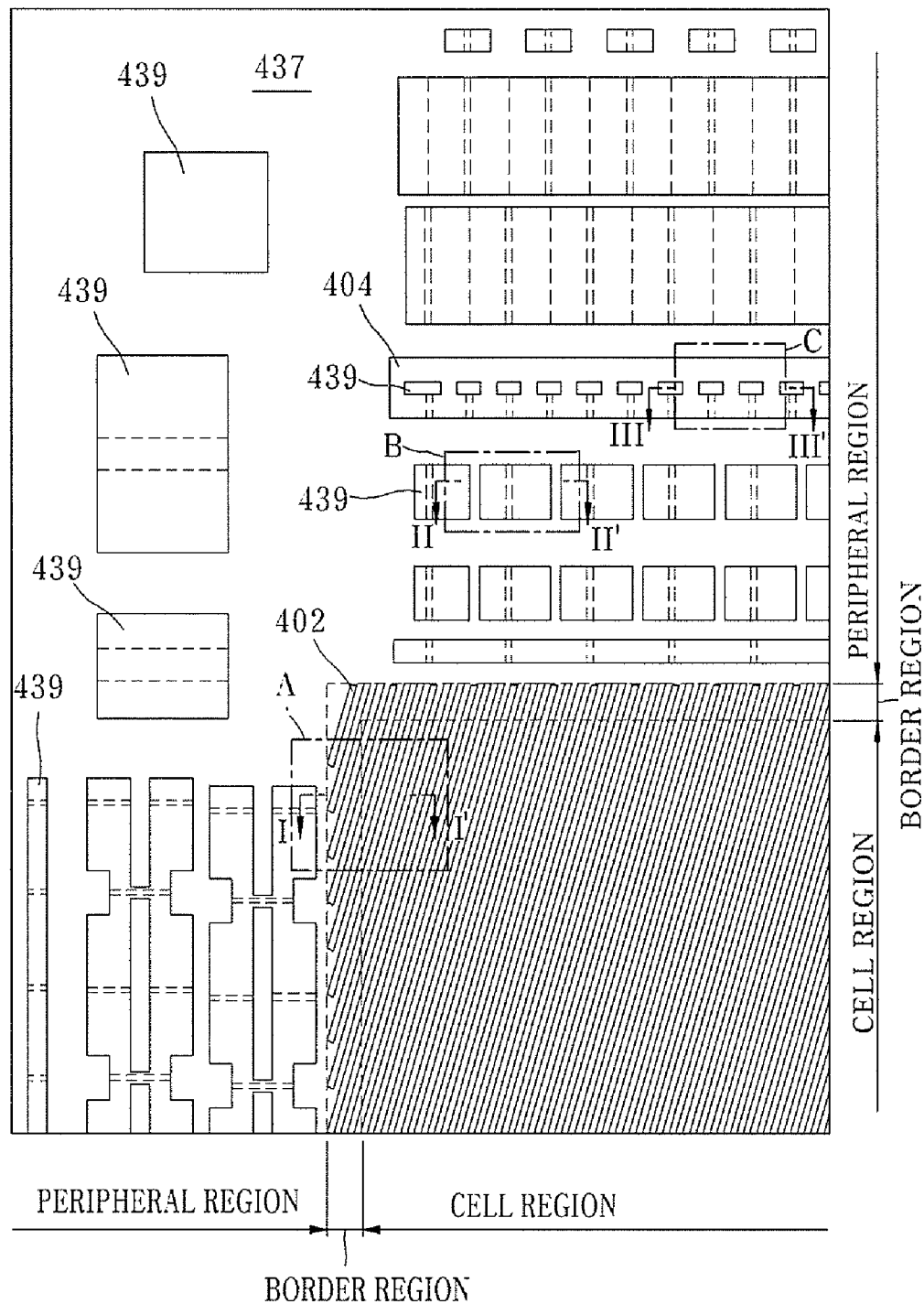
FIGS. 4 to 6 are plan views illustrating a mask layout which is used in a spacer patterning process according to an embodiment of the present invention.
Figure 5:
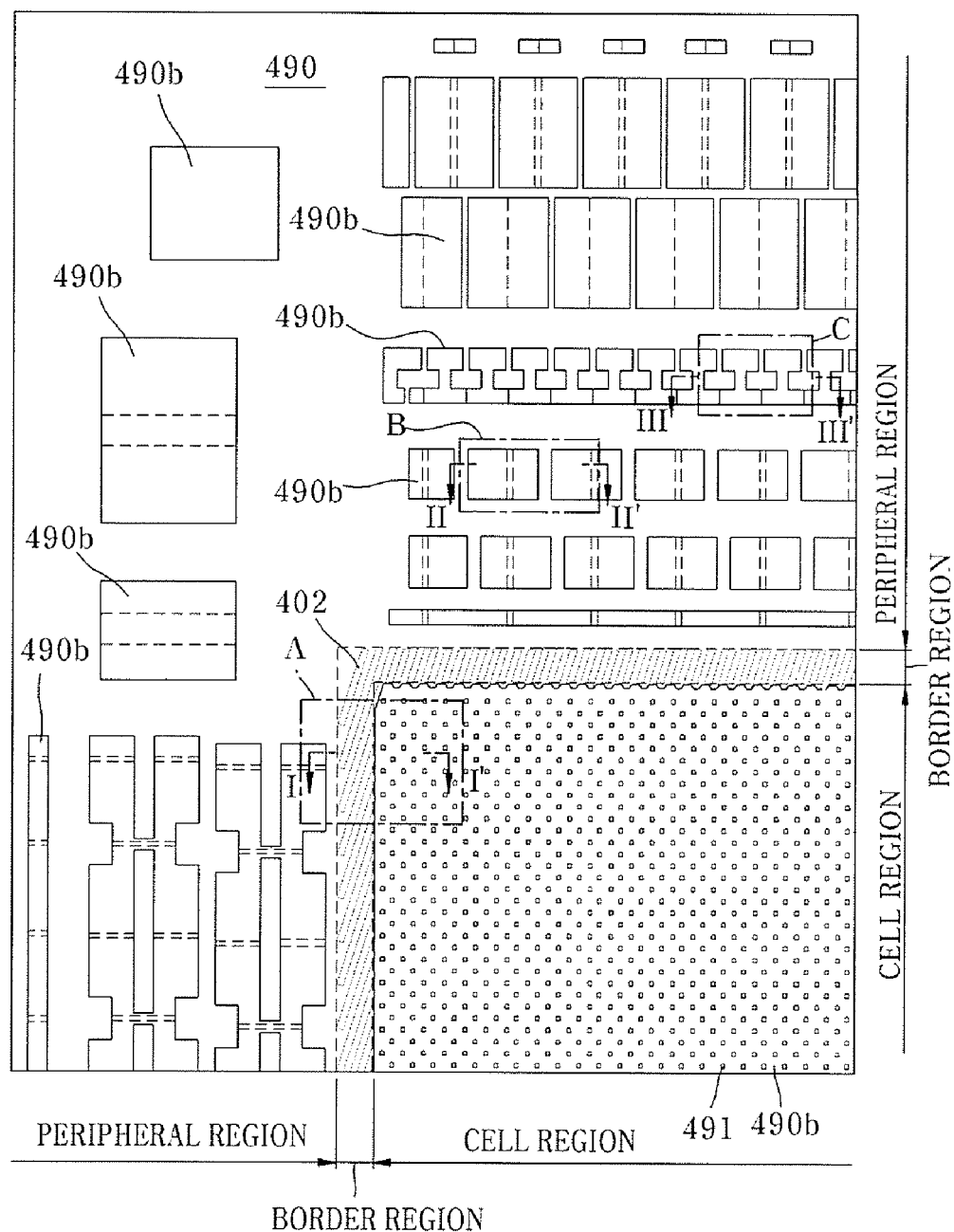
Figure 6:
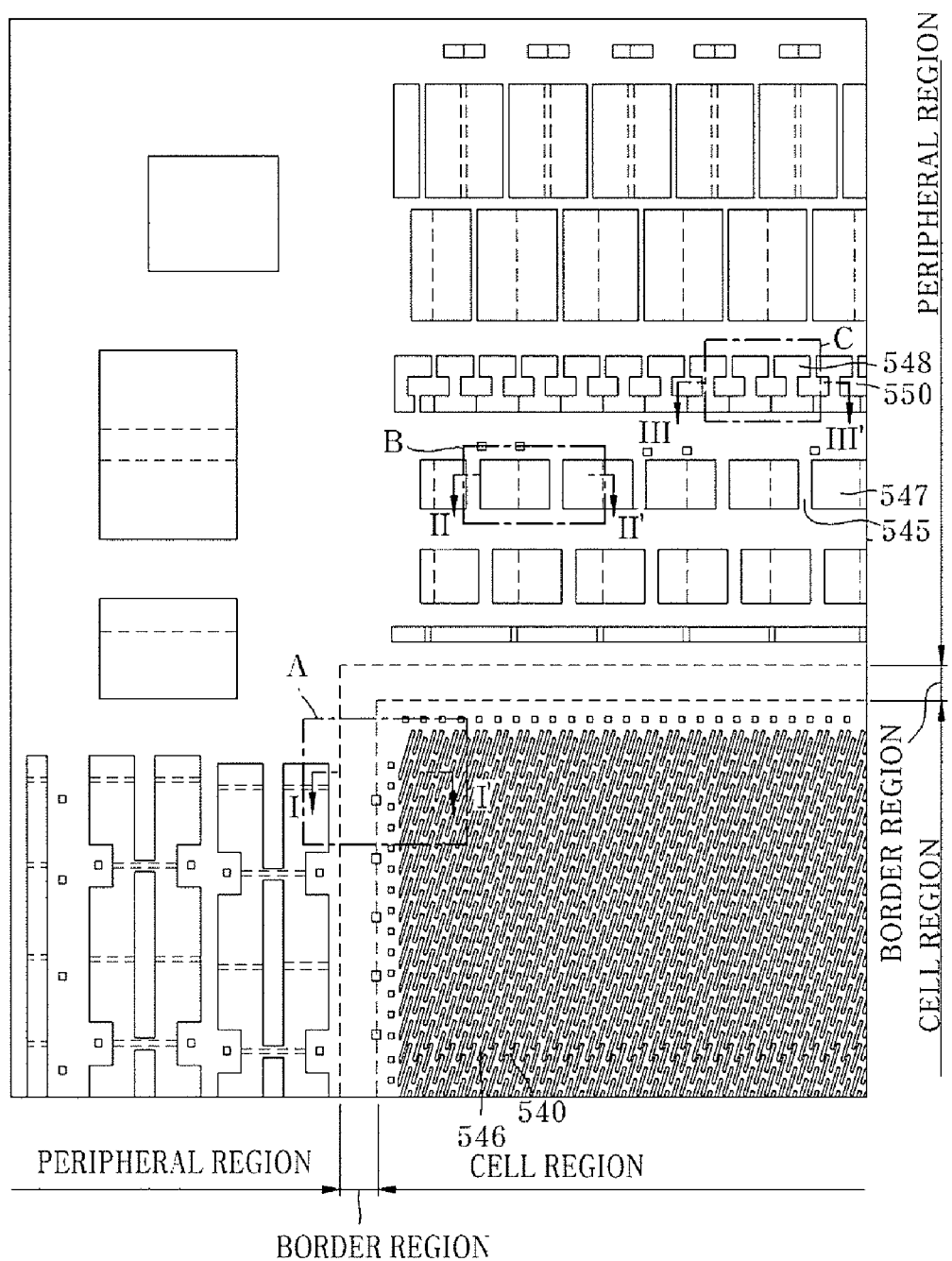

FIGS. 4 to 6 are some typical plan views illustrating a mask layout used in a spacer patterning process in accordance to an embodiment of the present invention. Specifically, FIG. 4 is a plan view of a partition layout, FIG. 5 is a plan view of a cutting layout, and FIG. 6 is a plan view of a target layout for forming a device isolation trench formed using the processes of FIGS. 4 and 5.

Referring to FIG. 4, the partition layout is applied to a process of forming a partition during a spacer patterning process. The partition layout includes a first region corresponding to a cell region of a wafer, a second region corresponding to a peripheral region surrounding the cell region, and a third region corresponding to a border region partitioning the cell region and the peripheral region.

Then entire region of the partition layout is used in an exposure process. A partition exposure mask where the partition layout is preferably disposed with a dark-tone photomask. Specifically, pattern layouts to be formed on the wafer are disposed on an opaque substrate 437 through hole-shaped light transmission portions 439.

The pattern layouts set by the light transmission portions 439 are formed on the wafer as reverse patterns in a subsequent exposure process. That is, the pattern layouts set by the light transmission portions 439 are transferred onto a resist film which is formed on the wafer. Referring again to FIG. 4, the pattern layouts transferred onto the wafer are formed as oblique patterns 402 which overlap cell patterns which will be arranged to form rows in the cell region, and are formed as reverse patterns 404 which overlap peripheral patterns which will be arranged in the peripheral region. The oblique patterns 402 are formed to overlap and extend on the border region which partitions the cell region and the peripheral region. The reverse patterns 404 are formed to be larger than the target patterns which will be finally formed. A detailed description of FIG. 4 will be made later.

Referring to FIG. 5, a cutting layout is applied to a process of removing unnecessary portions in the spacer patterning process. A cutting exposure mask where a cutting layout is disposed uses a clear-tone photomask. Specifically, pattern layouts to be formed on the wafer are disposed with patterns which are formed of a light shielding material on a transparent substrate 490. The cutting layout of the cell region includes holes 491 selectively exposing the patterns within the cell region, and an open region exposing the overlapping portion on the border region. Portions which are not described in the drawing are portions where the oblique patterns 402 of FIG. 4 are overlapped in the cutting layout.

Referring to FIG. 6, in the target layout for the device isolation trenches formed using the partition layout and the cutting layout, patterns are formed in the same shape as cell patterns in the cell region and the cell block edge region which is the outermost region adjacent to the peripheral region, and no bridges are formed. Also, patterns are formed in the peripheral region in such a state that a sufficient process margin is ensured in the partition layout. First patterns 546, 547 and 548 formed in the cell region and the peripheral region are regions where the active region is disposed, and second patterns are regions where the device isolation trenches 540, 545 and 550 are disposed.

Hereinafter, the embodiment of the present invention will be described below while exemplifying a process of forming device isolation trenches.

FIGS. 7 to 19C are views illustrating a method for fabricating a semiconductor device according to an embodiment of the present invention. FIG. 20 is a graph showing comparison of CDs between a cell edge region and a cell center region.

Figure 7:
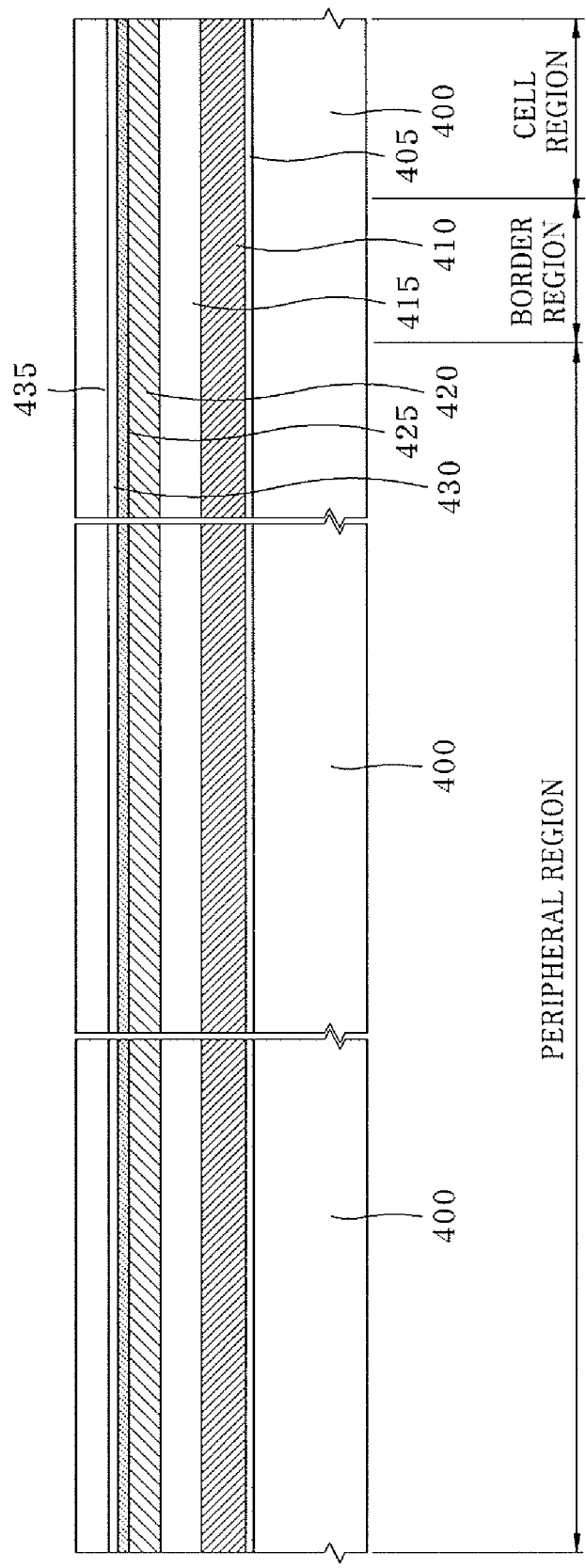
FIGS. 7 to 19C are views illustrating a method for fabricating a semiconductor device according to an embodiment of the present invention.

Referring to FIG. 7, a pad oxide film 405 and a pad nitride film 410 are formed over a wafer 400. The wafer 400 includes a cell region and a peripheral region surrounding the cell region. A border region is defined to partition the cell region and the peripheral region. As the cell region according an embodiment of the present invention, a cell block edge region which is an outer portion of a cell block will be taken as an example. Word line patterns or bit line patterns where an actual driving of the device is performed are formed in the cell region. A sense amplifier (SA) (not shown), sub word lines (SWD) (not shown), and sub holes (SH) (not shown) are disposed in the peripheral region. The border region between the cell region and the peripheral region functions as a buffer which causes defective patterns not to be formed in the cell block edge region in a subsequent process of transferring patterns onto the wafer. Meanwhile, a minimum space region may be further disposed in the peripheral region. The minimum space region is a region where patterns designed by setting a design rule to a minimum size are disposed.

Next, hard mask layers are formed on the pad nitride film 410. The hard mask layers are uses as an etching mask in a process of forming a partition of a spacer patterning technique. The hard mask layers are formed by sequentially depositing a first hard mask film 415, a partition layer 420, and a second hard mask film 425. An anti-reflection film 430 and a first resist film 435 are formed over the second hard mask film 425. The first hard mask film 415 includes a plasma enhanced tetraethyl ortho silicate (TEOS) film, and functions as a protection film which protects the underlying pad nitride film 410 in a subsequent etching process. The partition layer 420 includes a polysilicon film and defines a region where a target pattern will be formed in a spacer patterning process. The second hard mask film 425 functions as an etching mask in an etching process for patterning the partition layer 420. The second hard mask film 425 may include an amorphous carbon film. The anti-reflection film 430 substantially prevents reflection of light in an exposure process, and can include a silicon oxynitride (SiON) film. The first resist film 435 may be formed of a positive-type resist material.

Figure 8:
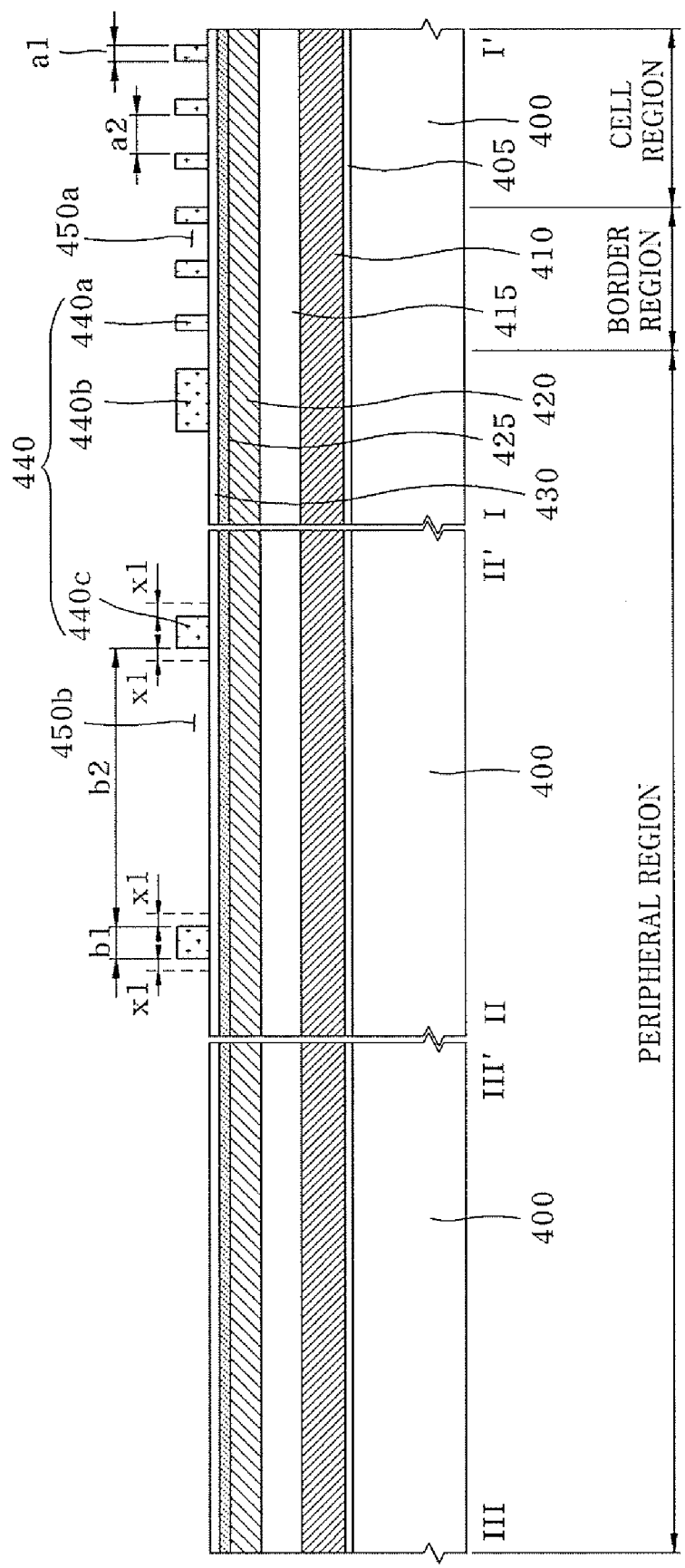

Referring to FIG. 8 which is a cross-sectional view taken along lines I-I', II-II' and of FIG. 4, a first resist pattern 440 including an oblique resist pattern 440a and reverse resist patterns 440b and 440c is formed. The oblique resist pattern 440a overlaps cell patterns which will be disposed in the cell region to form rows in an oblique direction, and the reverse resist patterns 440b and 440c have the same shape as the peripheral patterns which will be disposed in the peripheral region. Specifically, a partition exposure mask is disposed on the first resist film (435 in FIG. 5), wherein the partition layout of FIG. 4 is disposed on the partition exposure mask. Subsequently, the first resist pattern 440 is formed by performing a lithography process which includes an exposure process and a development process. The partition exposure mask uses a dark-tone photomask. As illustrated in FIG. 4, in the partition layout which is transferred onto the first resist film, pattern layouts are disposed on an opaque substrate 437 through light transmission portions 439. Oblique patterns and peripheral patterns set by the light transmission portions 439 are transferred onto the wafer, so that the first resist pattern 440 is formed in a reverse pattern. In other words, since the first resist pattern 440 is formed using a dark-tone mask, a width of the light shielding portion in the cell region corresponds to a width a1 of the oblique resist pattern 440a, and a width of the light transmission portion corresponds to a width a2 of a spacer 450a disposed between the oblique resist patterns 440a. Also, a width of the light shielding portion in the peripheral region corresponds to a width b1 of the reverse resist patterns 440b and 440c, and a width of a spacer which is a light transmission portion corresponds to a width b2 of a spacer 450b disposed between the reverse resist patterns 440b and 440c.

Figure 9A:
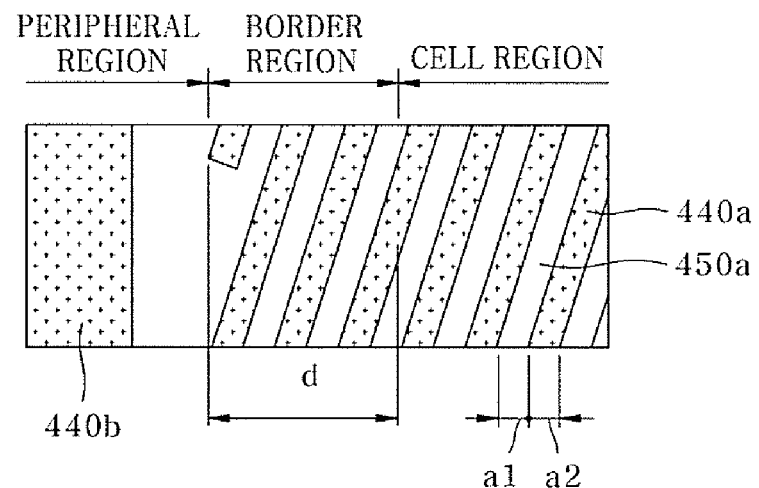

Referring to FIG. 8 and FIG. 9A which is a plan view illustrating a portion A of the cell region in FIG. 4, the oblique resist pattern 440a includes a resist film disposed to overlap the cell patterns which will be disposed in the cell region. The oblique resist pattern 440a includes line-and-space shaped patterns disposed in an oblique direction. The oblique resist pattern 440a extends up to a first length d so that it overlaps on the border region partitioning the cell region and the peripheral region. The oblique resist pattern 440a extends long enough to be adjacent to the reverse resist pattern 440b disposed in the peripheral region. However, the oblique resist pattern 440 extends to the extent that no bridge is caused by mutual optical interference with the reverse resist pattern 440b in an exposure process. A portion which extends from the oblique resist pattern 440a to the border region is a region which is particularly influenced by an OPC and a mask CD. On the other hand, a region which is formed on the cell region is almost not at all influenced by an OPC and a mask CD because a region extending to the border region functions as a buffer for the OPC in an exposure process.

Figure 9B:
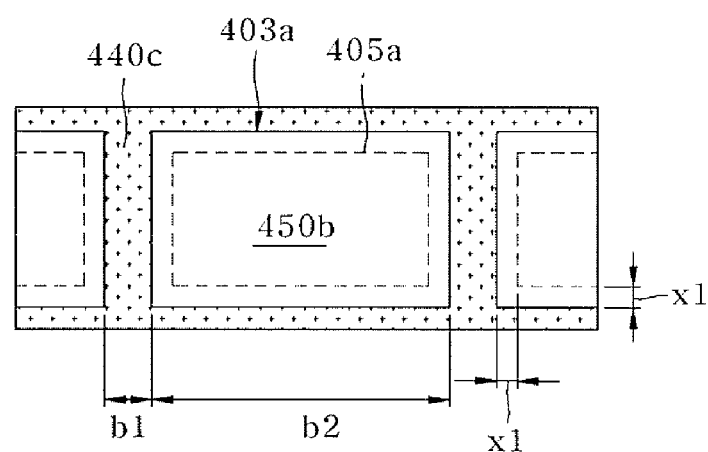

Referring to FIG. 8 and FIG. 9B which is a plan view illustrating a first region B of the peripheral region in FIG. 4, a reverse resist pattern 440c of a peripheral pattern including a resist film is disposed to overlap peripheral patterns. The first region B of the peripheral region is a region where a space for oversizing is sufficiently ensured in the peripheral region. A reverse pattern layout 403a of the peripheral pattern is formed to be larger than a final target layout 405a by a first width x1. The first width x1 which is formed to be large from the target layout 405a is equal to or greater than a width of a spacer which will be formed subsequently. For example, in case where a DRAM having a 31-nm 6F$^2$ layout is applied, when an actual target pattern is formed at 100 nm, the reverse layout of the peripheral pattern is formed to be larger than the target pattern by 25 nm to 30 nm. As such, when the reverse layout of the peripheral pattern is formed to be larger than the target layout, a process margin for forming a cutting mask may increase.

Figure 9C:
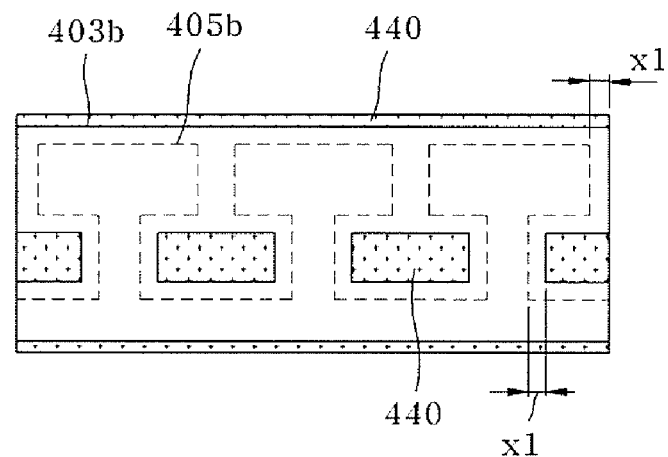

Referring to FIG. 8 and FIG. 9C which is a plan view a second region C of the peripheral region, a reverse resist pattern 440 of a peripheral pattern including a resist film is disposed. The second region C is a minimum space region where a space for oversizing is insufficient. In the second region C, a reverse pattern layout 403b of a peripheral pattern is formed to be larger than the final target layout 405b by a first width x1. The first width x1 which is formed to be large from the target layout 405b is formed as large as the thickness of a spacer which will be formed subsequently. The first width x1 which is formed to be large from the target layout 405b is equal to or greater than the width of the spacer which will be formed subsequently. In this case, the second region C is a minimum space region where patterns designed by setting a design rule to a minimum size are disposed. Thus, when the reverse pattern layout 403b extends from the target layout 405b by the first width x1, all the reverse layouts 403b are coupled together. Therefore, as illustrated in FIG. 8, the surface of the anti-reflection film 430 is exposed.

Figure 10:
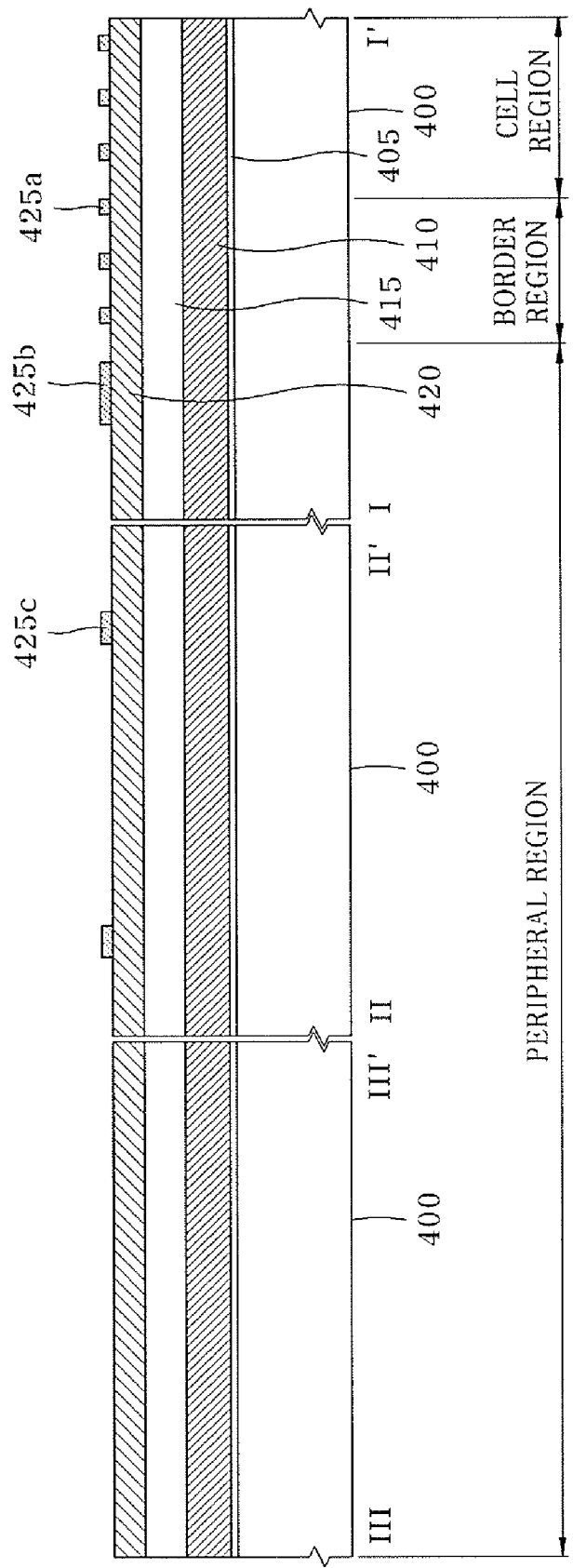

Referring to FIG. 10, an anti-reflection pattern (not shown) and second hard mask patterns 425a, 425b and 425c are formed by etching the anti-reflection film 430 and the second hard mask film 425 by using the first resist pattern (440 in FIG. 8) as an etching mask. The first resist pattern 440 and the anti-reflection pattern 430a are then removed. The surface of the partition layer 420 is partially exposed by the second hard mask patterns 425a, 425b and 425c. As a minimum space region in a III-III' direction is formed in a shape in which all the reverse layouts (403b in FIG. 9C) are coupled together, the partition layer 420 is exposed.

Figure 11:
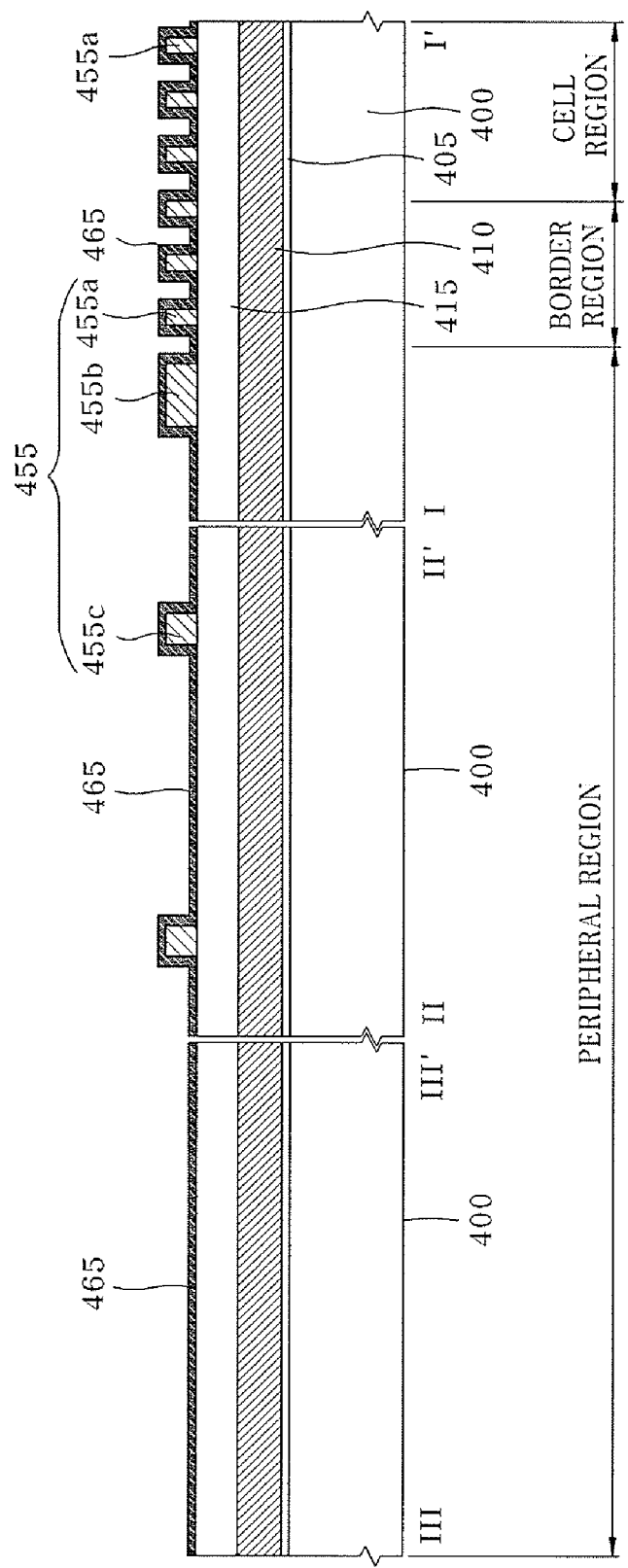

Referring to FIG. 11, a partition 455 is formed by etching the partition layer 420 by using the second hard mask patterns 425a, 425b and 425c as an etching mask. The surface of the first hard mask film 415 is partially exposed by the partition 455. The partition 455 includes oblique patterns 455a extending to be overlapped on the cell region and the border region, and a reverse pattern 455c of a peripheral pattern formed in the peripheral region. A spacer layer 465 is formed over the partition 455 and the exposed surface of the first hard mask film 415. The spacer layer 465 is preferably formed of oxide. The spacer layer 465 is formed to cover the exposed surface of the first hard mask film 415 while surrounding the oblique patterns 455a and the reverse pattern 455c of the peripheral pattern.

Figure 12:
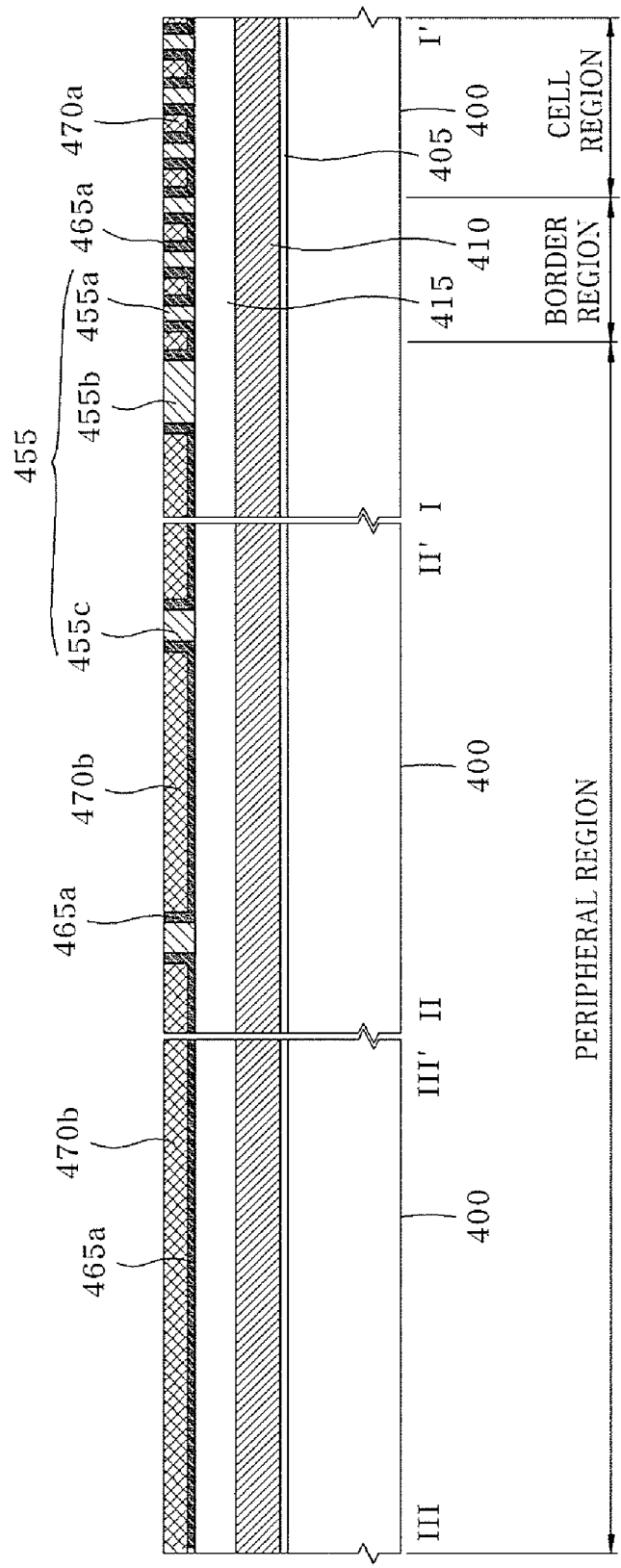
Figure 13A:
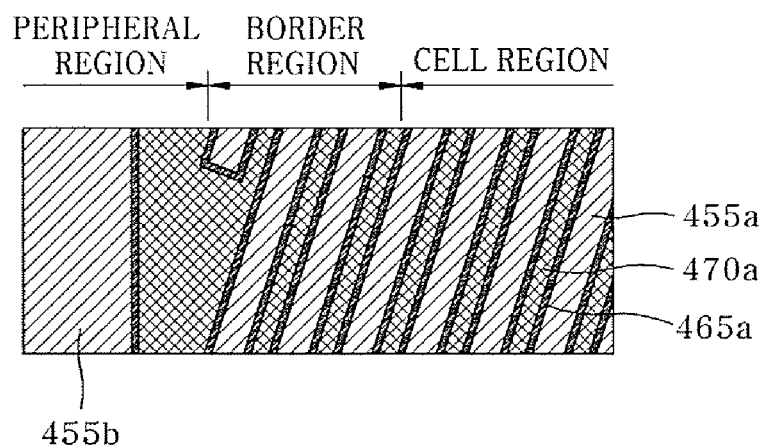
Figure 13B:
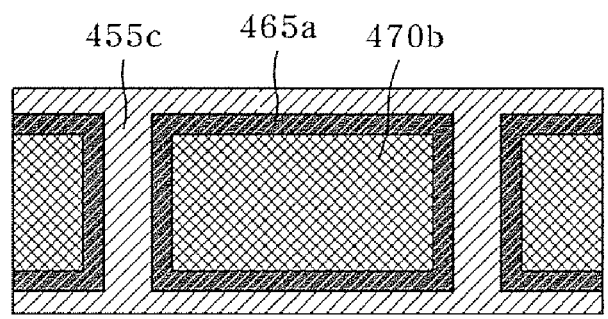
Figure 13C:
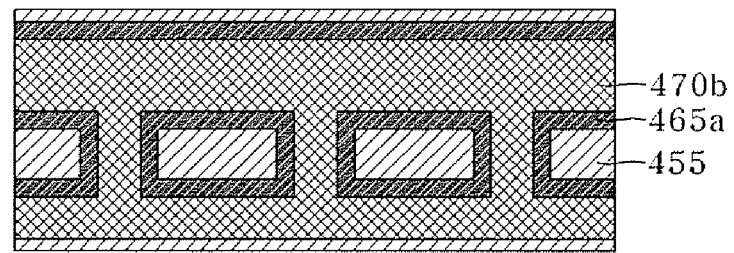

Referring to FIGS. 12 to 13C, first burying patterns 470a are formed between the oblique patterns 455a, and second burying pattern 470b are formed around the reverse pattern 455c of the peripheral pattern. Specifically, the burying layer is formed over the spacer layer 465, the oblique patterns 455a, and the reverse pattern 455c of the peripheral pattern. The burying layer is formed thick enough to bury the spacer layer 465, the oblique patterns 455a, and the reverse pattern 455c. The burying layer may be formed of the same material as the oblique patterns 455a and the reverse pattern 455c, for example, may be formed of polysilicon, in order that it is easily removed in a subsequent cutting mask process.

The top surfaces of the oblique patterns 455a and the reverse pattern 455c of the peripheral pattern are exposed by performing a planarization process on the burying layer. The planarization process may be performed by a chemical mechanical polishing (CMP) process and/or an etch-back process. Through the planarization process, the first burying patterns 470a disposed between the oblique patterns 455a and the second burying pattern 470b disposed around the reverse patterns 455b and 455c are formed. The planarization process is performed substantially uniformly over the entire wafer. However, when the pattern density difference between the cell region and the peripheral region increases, the planarization process is performed with different profiles in a region having a high pattern density and the region having a low pattern density. When the planarization process is performed with the different profiles, dishing may occur or the CD uniformity may be degraded. However, according to the embodiment of the present invention, since the patterns are formed in both the cell region and the peripheral region, the pattern density difference in each region of the wafer is reduced. Therefore, it is possible to reduce the degradation of the CD uniformity, which is caused by dishing which can occurs when the planarization process is performed on patterns that are only formed in the cell region.

Figure 14:
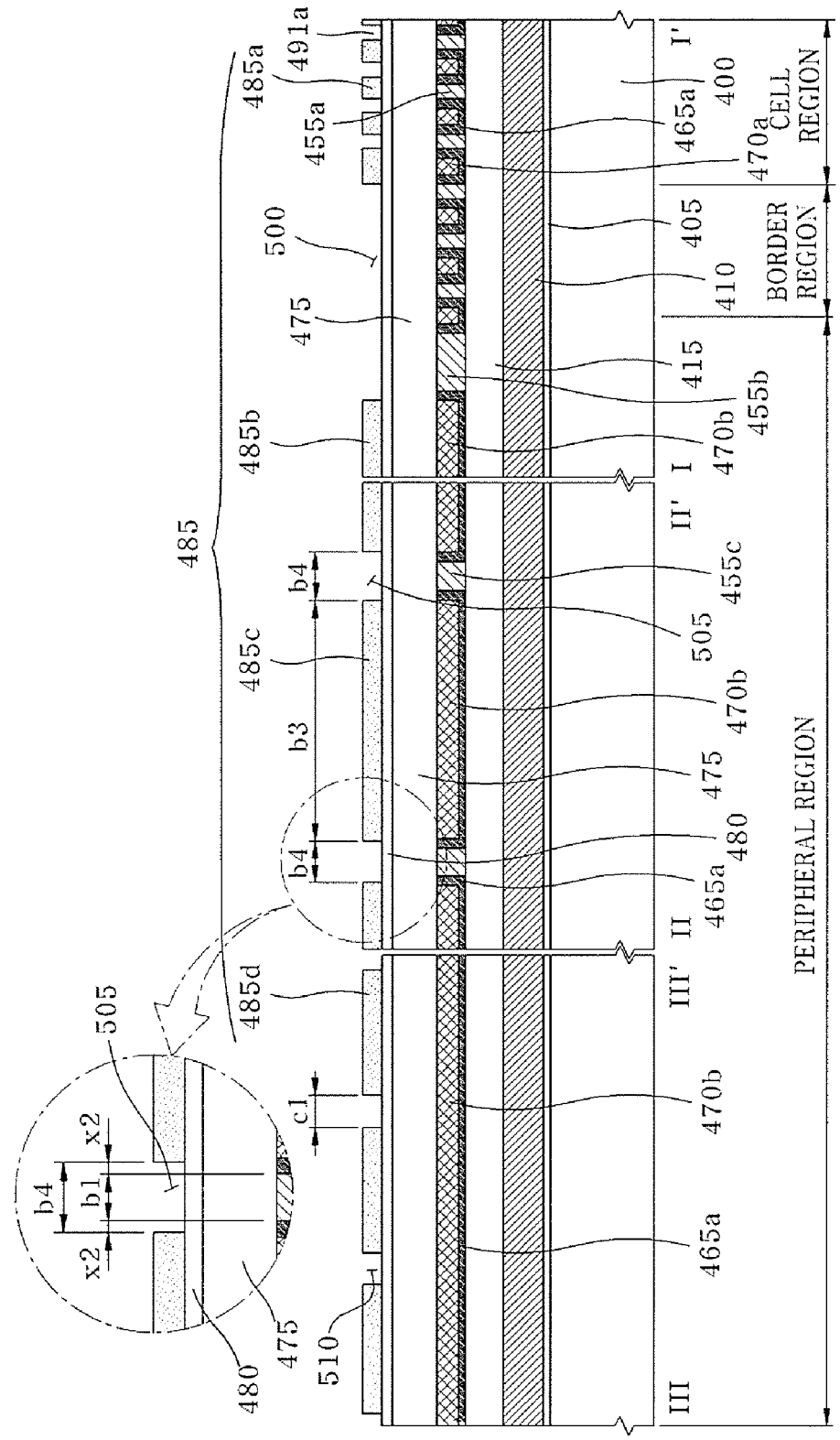

Referring to FIG. 14, a third hard mask film 475 and an anti-reflection film 480 are formed over the first burying patterns 470a and the second burying pattern 470b. A resist film (not shown) is coated over the anti-reflection film 480. A cutting exposure mask is disposed on the resist film, wherein the cutting layout of FIG. 5 is disposed on the cutting exposure mask. As illustrated in FIG. 5, on the cutting exposure mask, a cutting layout is disposed which includes holes 491 selectively exposing the patterns within the cell region, and open portions selectively exposing the peripheral region and the region overlapped on the border region. The holes 491 expose the middle portions of the oblique patterns 455a and the first burying patterns 470a. A second resist pattern 485 is formed by transferring the holes 491 and the open portions of the cutting mask onto the resist film. The second resist pattern 485 includes holes (491 in FIG. 5) exposing the middle portions of the oblique patterns 455a and the first burying patterns 470a, a first open portion 500 exposing the overlapped region on the border region, and second open portions 505 and 510 exposing the reverse patterns 455b and 455c. A width b4 of the second open portion 505 in a II-II' direction is larger than a width b1 of the reverse pattern 455c, except a thickness x2 of the underlying spacer 465.

Figure 15A:
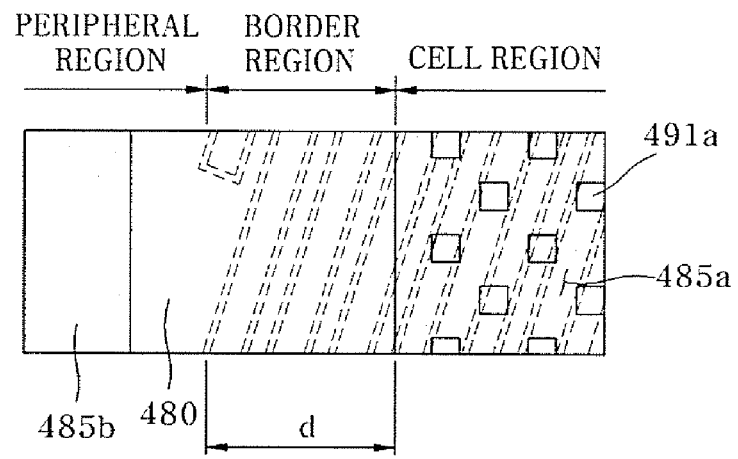

Referring to FIG. 14 and FIG. 15A which is a plan view of the portion A of the cell region in FIG. 5, a resist cell pattern 485a is disposed in the cell region, wherein the holes 491a exposing the middle portions of the oblique patterns 455a and the first burying pattern (470a in FIG. 14) are disposed on the resist cell pattern 485a. The holes 491a are preferably formed in dot shapes. Also, a second resist pattern 485 includes a first open portion 500 exposing the overlapped region of the oblique patterns on the border region. Since the holes 491a are very fine, they are preferably formed using RELACS material.

Figure 15B:
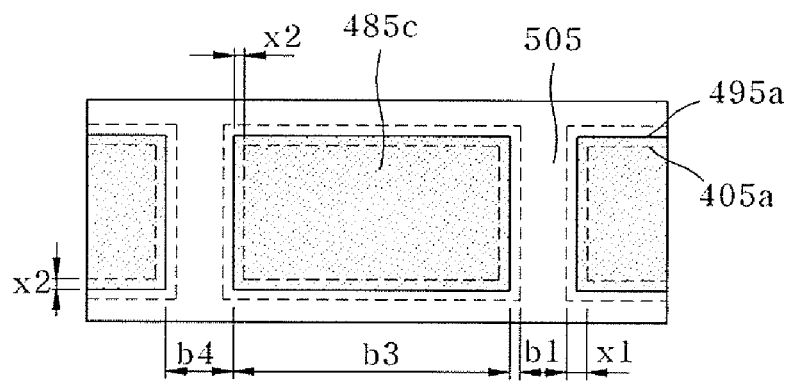

Referring to FIG. 14 and FIG. 15B which is a plan view illustrating the first region B of the peripheral region, a peripheral resist pattern 485c having a peripheral pattern shape is disposed. A layout 495a of the peripheral resist pattern 485c set by the cutting layout of FIG. 5 is formed to be larger than the target layout 405b by a second width x2. The width which is preferably set to be larger by the second width x2 from the target layout 405b is formed to preferably have half the first width x1 of the reverse pattern layout 485c which is set in FIG. 9B. Also, the peripheral resist pattern 485c includes a second open portion 505 exposing a region corresponding to the reverse pattern 455b of the peripheral pattern. A gap b4 of the second open portion 505 exposes the entire region corresponding to the reverse pattern 455b, and exposes substantially half the region corresponding to the spacer 465. Therefore, a width b3 of the peripheral resist pattern 485c is disposed between the first width x1 extending from the target layout 405b and the second width x2.

Figure 15C:
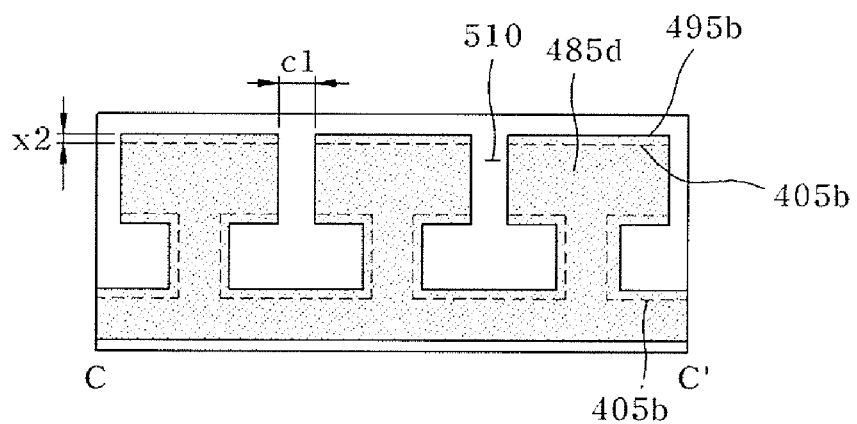

Referring to FIG. 14 and FIG. 15C which is a plan view illustrating the second region C of the peripheral region in FIG. 5, a peripheral resist pattern 485d having a peripheral pattern shape is disposed. A layout 495a of the peripheral resist pattern 485d set by the cutting layout of FIG. 5 is formed to be lager than the target layout 405b by a second width x2. The width which is preferably set to be larger by the second width x2 from the target layout 405b is about half the first width x1 of the reverse pattern layout 403a which is set in FIG. 9C. Also, the peripheral resist pattern 485d includes a second open portion 510 exposing the region corresponding to the reverse pattern 455c of the peripheral pattern. The second open portion 510 exposes substantially the entire region corresponding to the reverse pattern 455c, and exposes a third width c1 of a region where the reverse layouts (403c in FIG. 9C) are coupled together.

Figure 16:
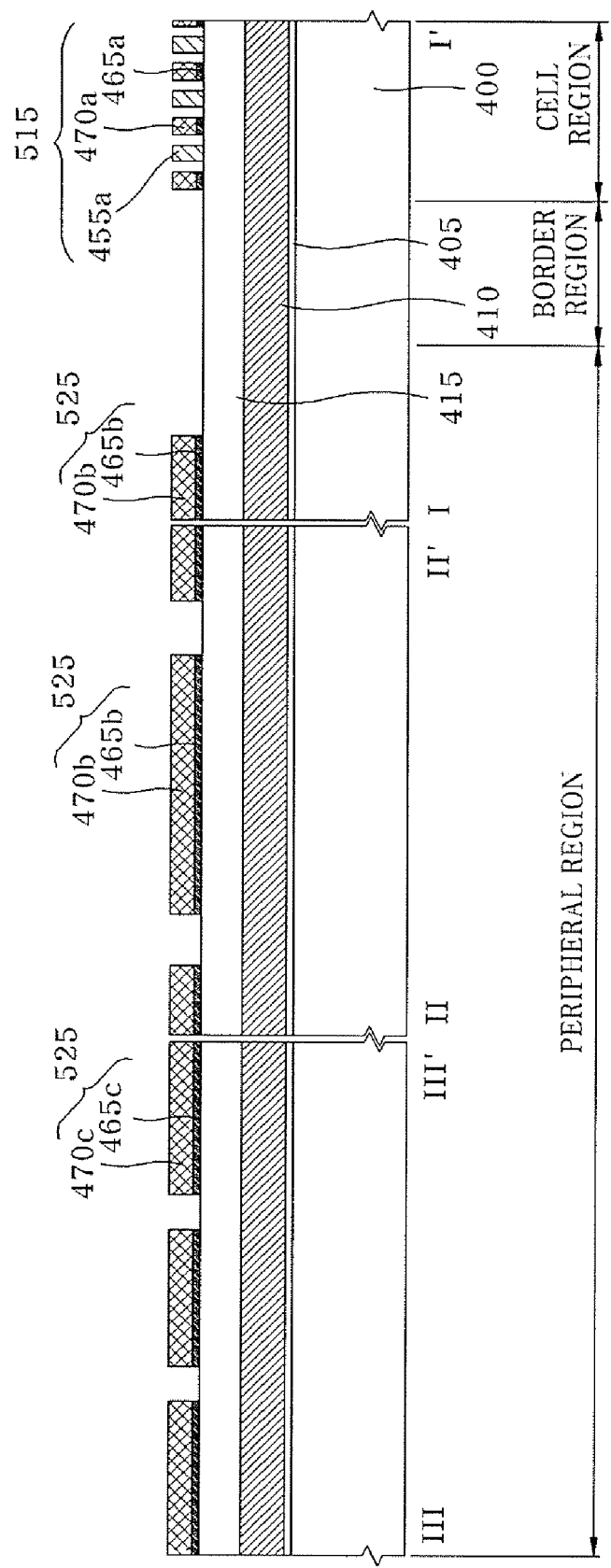

Referring to FIG. 16 the exposed region is etched using the second resist pattern 485 as an etching mask. The exposed region includes holes 491a exposing the middle portions of the oblique patterns 455a and the first burying pattern 470a, the first open portion (500 in FIG. 14) exposing the overlapped region on the border region, and the second open regions (505 and 510 in FIG. 14) exposing the reverse patterns 455b and 455c. When an etching process is performed using the second resist pattern 485 as an etching mask, the cell region is patterned in a shape of the holes 491a, and the middle portions of the oblique patterns 455a and the first burying pattern 470a disposed under the third hard mask film 475 are etched in a hole shape. In addition, an etching process is performed on the first open portion 500 exposing the overlapped region on the border region, and the second open portions 505 and 510 exposing the reverse patterns 455b and 455c.

In this manner, the oblique patterns 455a and the first burying pattern 470a in the cell region are cut in the middle and divided to form cell patterns 515 forming rows in an oblique direction, and the reverse patterns 455b and 455c and the spacer are removed to form a peripheral pattern 525 including the second burying patterns 470b and 470c. The spacer is selectively removed.

Figure 17:
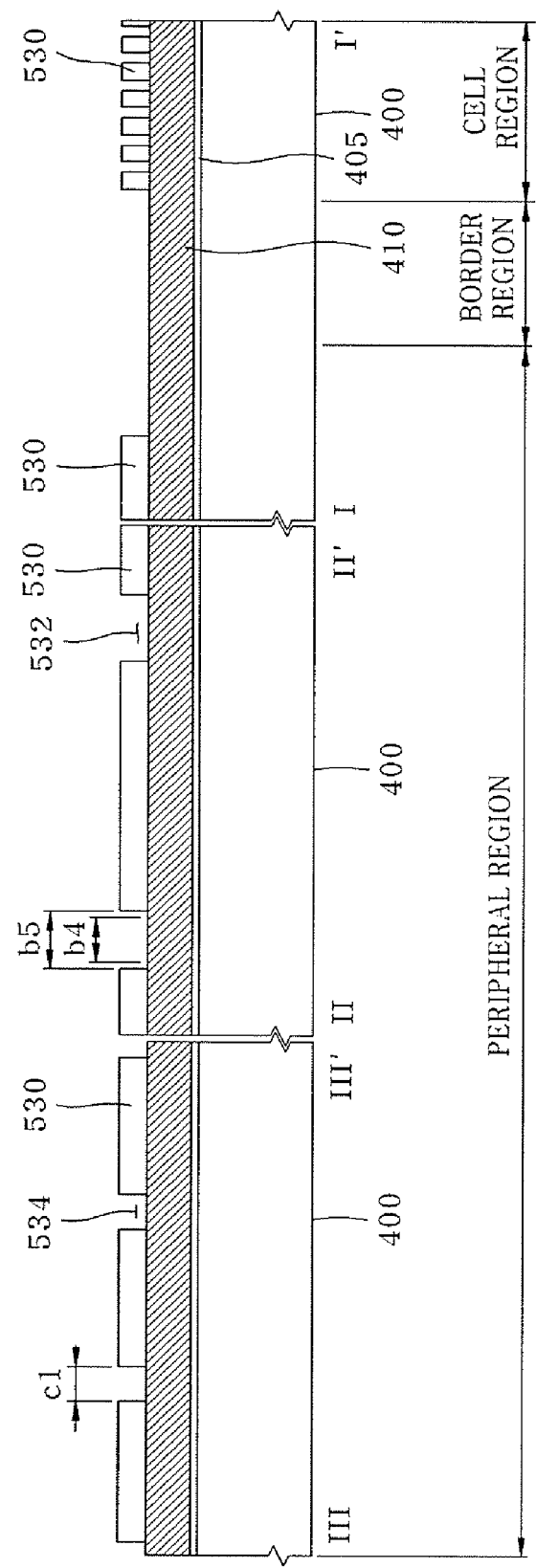

Referring to FIG. 17, a third hard mask pattern 530 is formed by etching the exposed region of the third hard mask film 475 using the cell pattern 515 and the peripheral pattern 525 as an etching mask. Since the spacer attached to the sidewall of the reverse pattern 455c is removed in the etching process for forming the cell pattern (515 in FIG. 16) and the peripheral pattern 525, an open portion 532 of the third hard mask pattern 530 in a II-II' direction is formed to have a gap b5 wider than a gap b4 of the second open portion (505 in FIG. 15B). An open portion 534 of the third hard mask pattern 530 in a III-III' direction is formed to have a width substantially equal to the third width (c1 in FIG. 15C).

Figure 18:
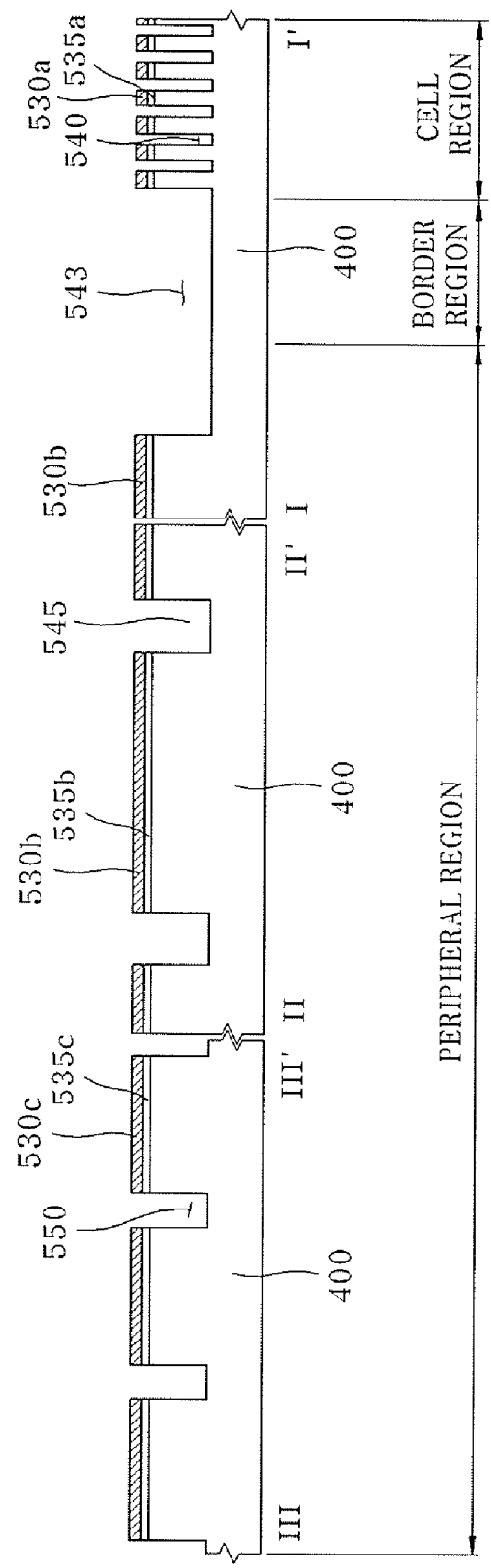

Referring to FIG. 18, device isolation trenches 540, 543, 545 and 550 are formed within the wafer 400 by sequentially etching the pad nitride film 410, the pad oxide film 405, and silicon of the wafer 400 by using the third hard mask pattern 530 as an etching mask. Specifically, a mask pattern including pad nitride patterns 530a, 530b and 530c and pad oxide patterns 535a, 535b and 535c are formed by etching the pad nitride film 410 and the pad oxide film 405 by using the third hard mask pattern 530 as an etching mask. Device isolation trenches 540, 543, 545 and 550 are formed by etching silicon of the wafer 400 by using the mask pattern as an etching mask. The etching process for forming the device isolation trenches uniformly influences substantially the entire surface of the wafer. However, when the pattern density difference between the cell region and the peripheral region increases, a region having a high pattern density and a region having a low pattern density have different bias values and profiles. The different bias values and profiles cause the degradation in the CD uniformity of the active region. In the embodiment of the present invention, the patterns are formed in both the cell region and the peripheral region. Thus, the pattern density difference in each region of the wafer is reduced. Consequently, it is possible to reduce the degradation of the CD uniformity, which is caused by a loading effect which occurs in the etching process.

Figure 19A:
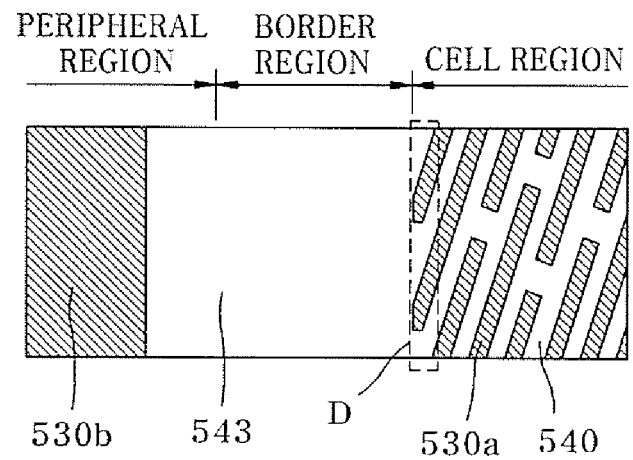
Figure 20:
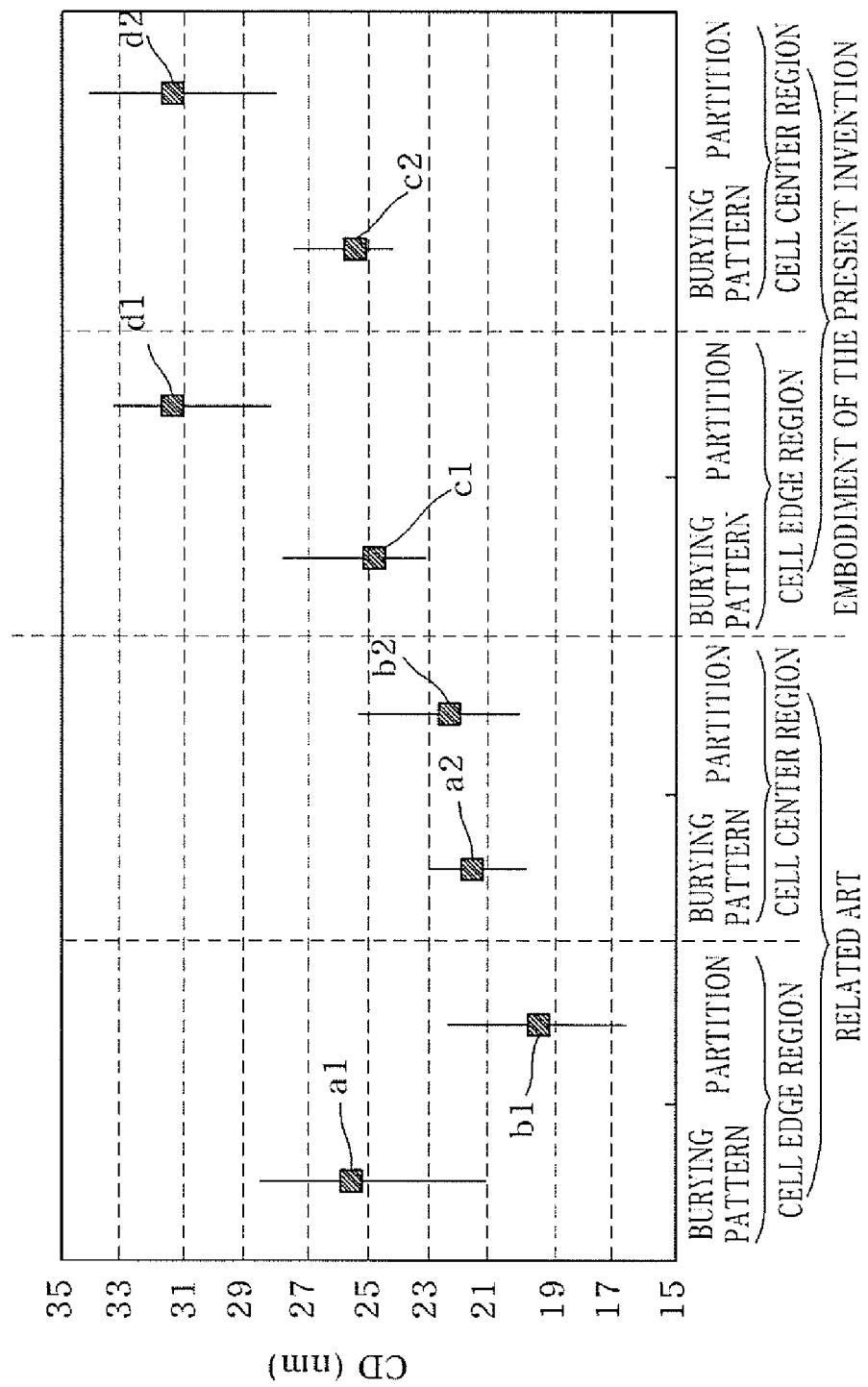
FIG. 20 is a graph showing comparison of CDs between a cell edge region and a cell center region.

Referring to FIG. 19A which is a plan view illustrating the cell region I-I' of FIG. 18, substantially no bridges occur in the cell region and the cell block edge region which is the outermost region D adjacent to the peripheral region, as opposed to the related art in which bridges (115 in FIG. 1) are prone to occurring.

Figure 19B:
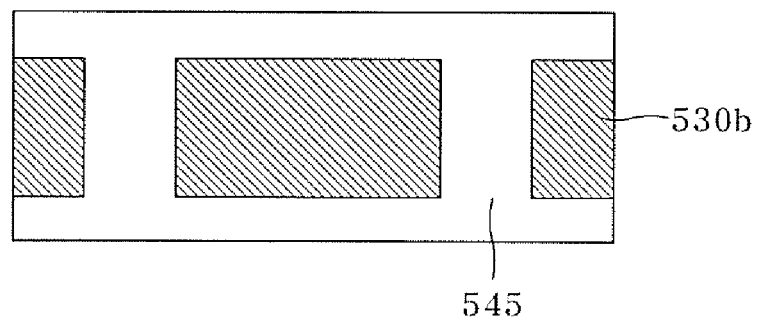
Figure 19C:
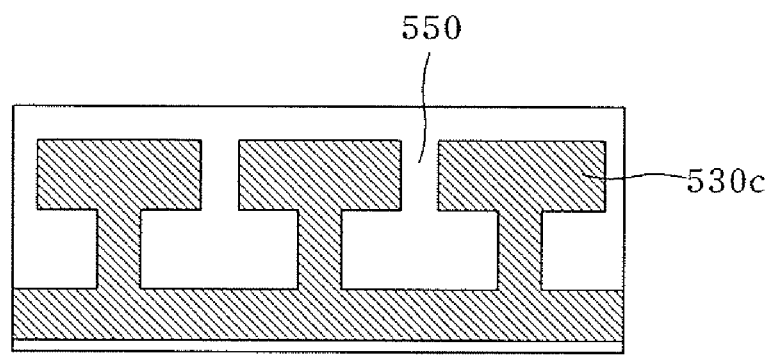

Referring to FIGS. 19B and 19C which are plan views illustrating the first region B and the second region C of the peripheral region in FIG. 18, the peripheral pattern (525 in FIG. 16) is formed in the peripheral region so that a sufficient process margin is ensured using the partition exposure mask. Thus, the influence by the pattern density of the cell region is reduced. In addition, the peripheral pattern where the process margin is ensured is formed in the peripheral region while the pattern is formed in the cell region in the partition exposure mask process. Thus, the pattern density difference on each region can be reduced. Therefore, it is possible to improve CD uniformity, minimize bridging, and limit dishing distortion effects, which are all caused by the pattern density differences.

The deposition process, the planarization process, and the etching process, which are performed through the spacer patterning process, substantially uniformly influences the entire surface of the wafer. However, when the pattern density difference between the cell region and the peripheral region increases, a region having a high pattern density and a region having a low pattern density have different bias values and profiles. The different bias values and profiles contribute to CD uniformity degradation in the active region. In the embodiment of the present invention, the patterns are formed in the peripheral region while the patterns are formed in the cell region in the process of forming the partition. Thus, the pattern density difference in each region of the wafer is reduced. Consequently, it is possible to reduce the degradation in the CD uniformity due to the loading effect or the dishing effect, which is caused by the pattern density difference in the subsequent patterning process, deposition process, planarization process, and etching process.

Specifically, referring to FIG. 20 which illustrates comparison of CDs between the cell edge region and the cell center region, in case where no patterns are formed in the peripheral region when the patterns are formed in the cell region in the partition exposure mask process, it can seen that the partition CD b1 of the cell edge region is smaller than the partition CD b2 of the cell center region when the partition CD b2 is set with reference to the cell center region. Furthermore, as the partition CD b1 of the cell edge region becomes smaller, it can be seen that the CD of the burying pattern burying the gap between the partitions increases toward the cell edge regional rather than the cell center region a2. Accordingly, the CD of the device isolation trench becomes smaller toward the cell edge region, and defects such as bridges occur.

On the contrary, according to the embodiment of the present invention, there is almost no difference between the partition CD d2 of the cell center region and the partition CD d1 of the cell edge region. Hence, it can be seen that there is almost no difference between the burying pattern CD c2 of the cell center region and the burying pattern CD c1 of the cell edge region. Consequently, since the CD uniformity is uniformly maintained in each region of the wafer, the device isolation trenches having the desired profiles can be implemented.

Furthermore, the degradation in the CD uniformity according to the open ratio of the each region within the chip can be substantially prevented by reducing the pattern density difference between the cell region and the peripheral region. For example, it is possible to substantially prevent the degradation in the CD uniformity, which is caused by flare noise due to light wandering in the exposure process, and chemical noise due to resist residues. Moreover, the cell patterns extend to be overlapped with the peripheral region on the border region, and the peripheral patterns are formed on the peripheral region. Consequently, since the processes of the cell block edge region and the cell center region are performed in a similar manner, it is possible to substantially prevent the degradation in the CD uniformity which is caused by the process difference.

According to the embodiments of the present invention, since the region which is influenced during the OPC process in the cell block edge region and the region which is influenced by the OPE are removed using the cutting exposure mask, the influence by the OPC and the mask CD can be reduced.

In the partition exposure mask process, the patterns of the cell region extend in the direction of the peripheral region and the patterns are formed in the core region and the peripheral region. Therefore, the pattern density difference is reduced in the factors which influence the CD uniformity of the active region.

Consequently, the CD uniformity can be improved. Furthermore, since the patterns are formed in both the core region and the peripheral region during the partition exposure mask process, influence by stray light flare and chemical flare is reduced, thereby improving the CD uniformity. Moreover, in the partition exposure mask process, it is possible to improve the process margin with respect to the minimum space region of the core region and the peripheral region.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for fabricating a semiconductor device, comprising:
   obtaining a target layout of cell patterns, which form rows in a cell region, and peripheral patterns of a peripheral region;
   forming oblique patterns which alternately overlap the rows of the cell patterns and forming a reverse pattern of the peripheral patterns;
   attaching spacers to sidewalls of the oblique patterns and the reverse pattern;
   forming first burying patterns between the oblique patterns and forming a second burying pattern around the reverse pattern by filling gaps between the spacers; and
   forming the cell patterns by cutting and dividing middle portions of the oblique patterns and the first burying patterns, and setting the peripheral pattern with the second burying pattern by removing the reverse pattern.

2. The method of claim 1, wherein the cell patterns are arranged along a $6F^2$ or a $4F^2$ cell layout.

3. The method of claim 1, wherein the cell patterns are arranged in an oblique direction.

4. The method of claim 1, wherein the forming of the reverse pattern comprises:
   obtaining a reverse layout of the target layout of the peripheral pattern; and
   reducing a size of the reverse layout.

5. The method of claim 4, wherein the size of the reverse layout is reduced by a spacer width or more than the spacer width.

6. The method of claim 1, wherein the oblique patterns, the reverse pattern, the first burying patterns, and the second burying patterns are formed of substantially the same material.

7. A method for fabricating a semiconductor device, comprising:
   forming a hard mask film and a partition layer over a wafer where a cell region and a peripheral region are defined;
   patterning the partition layer to form oblique patterns which are alternately overlapped with rows of cell patterns to be disposed in the cell region, and patterning a reverse pattern of peripheral patterns which are to be disposed in the peripheral region;
   attaching spacers to sidewalls of the oblique patterns and the reverse pattern;
   forming first burying patterns between the oblique patterns and forming a second burying pattern around the reverse pattern by filling gaps between the spacers;
   forming the cell patterns by cutting and dividing middle portions of the oblique patterns and the first burying patterns, and setting the peripheral pattern with the second burying pattern by removing the reverse pattern;
   selectively removing the spacers; and
   forming a hard mask pattern by selectively etching an exposed region of the hard mask film by using the cell patterns and the peripheral pattern as an etching mask.

8. The method of claim 7, wherein the cell patterns are arranged along a $6F^2$ or a $4F^2$ cell layout.

9. The method of claim 7, wherein the cell patterns are arranged in an oblique direction.

10. The method of claim 7, wherein a gap of the reverse pattern is formed at a location which is spaced apart by a space of the peripheral pattern.

11. The method of claim 7, wherein forming of the first burying patterns and the second burying pattern comprises:
   burying the oblique patterns, the reverse pattern, and the spacer with a burying layer after the process of attaching the spacers; and
   performing a planarization process on the burying layer to expose top surfaces of the oblique patterns, the reverse pattern, and the spacer.

12. The method of claim 11, wherein the planarization process is performed by a chemical mechanical polishing (CMP) process or an etch-back process.

13. The method of claim 7, further comprising, after forming the hard mask pattern:
   forming a device isolation trench having a first width in the cell region by etching the wafer of the cell region and the peripheral region by using the hard mask pattern as an etching mask; and
   forming another device isolation trench having a second width in the peripheral region, such that the second width is wider than the first width.

14. The method of claim 7, wherein the forming of the oblique patterns and the peripheral pattern comprises:
   forming a resist film over the partition layer after forming the partition layer;
   obtaining a target layout of cell patterns which form rows in the cell region and peripheral patterns which are to be disposed in the peripheral region;
   obtaining a reverse layout of a target layout of the cell patterns and the peripheral pattern;
   reducing the size of the reverse layout;
   transferring the reverse layout onto the resist film; and
   patterning the partition layer by using the resist film onto which the reverse layout is transferred.

15. The method of claim 14, wherein the size of the reverse layout is reduced by about the width of the spacer or by about more than the width of the spacer.

16. The method of claim 7, wherein an etching loading effect of the peripheral region is reduced in the process of forming the reverse pattern and the process of removing the reverse pattern.

17. The method of claim 7, wherein the hard mask layer comprises a single film or a stacked film selected from the group consisting of a PETEOS (Plasma Enhanced Tetraethylorthosilicate) film, an amorphous carbon film, a nitride film, and an oxide film.

18. The method of claim 7, wherein the partition layer, the first burying pattern, and the second burying pattern are formed of substantially the same material.

19. The method of claim 7, wherein the setting of the cell pattern and the peripheral patterns comprises:
    forming a resist film over the first burying patterns and the second burying pattern after the process of forming the first burying patterns and the second burying pattern;
    disposing a cutting mask over the resist film, the cutting mask including holes, which expose the middle portions of the oblique patterns and the first burying patterns, and an open portion, which exposes the reverse pattern;
    forming a resist pattern by transferring the holes and the open portion of the cutting mask onto the resist film; and
    selectively etching and removing exposed regions of the resist pattern.

20. The method of claim 19, wherein the open portion of the resist pattern exposes an entire region of the reverse pattern, and exposes about half of the spacer.

21. A method for fabricating a semiconductor device, comprising:
    obtaining a target layout of cell patterns, which form row in a cell region, and peripheral patterns of a peripheral region;
    forming oblique patterns, which are alternately overlapped in rows of the cell patterns and which extend on a border region between the cell region and the peripheral region, and forming a reverse pattern of the peripheral patterns;
    attaching spacers to sidewalls of the oblique patterns and the reverse pattern;
    forming first burying patterns between the oblique patterns and a second burying pattern around the reverse pattern by filling gaps between the spacers; and
    forming cell patterns by cutting and dividing middle portions of the oblique patterns and the first burying patterns, and setting the peripheral pattern with the second burying pattern by removing the reverse pattern.

22. The method of claim 21, wherein the cell patterns are arranged along a 6F$^2$ or a 4F$^2$ cell layout.

23. The method of claim 21, wherein the cell patterns are arranged in an oblique direction.

24. The method of claim 21, wherein the oblique patterns, the reverse pattern, the first burying patterns, and the second burying pattern are formed of substantially the same material.

25. The method of claim 21, wherein the forming of the reverse pattern comprises:
    obtaining a reverse layout of the target layout of the peripheral pattern; and
    reducing the size of the reverse layout.

26. The method of claim 25, wherein the size of the reverse layout is reduced by the width of the spacer or by more than the width of the spacer.

27. The method of claim 21, wherein the setting of the cell pattern and the peripheral patterns comprises:
    forming a resist film over the first burying patterns and the second burying pattern after the process of forming the first burying patterns and the second burying pattern;
    disposing a cutting mask over the resist film, the cutting mask including holes exposing the middle portions of the oblique patterns and the first burying patterns, a first open portion exposing the overlapped region on the border region, and a second open portion exposing the entire reverse pattern;
    forming a resist pattern by transferring the holes, the first open portion, and the second open portion of the cutting mask onto the resist film; and
    selectively etching and removing exposed regions of the resist pattern.

28. A method for fabricating a semiconductor device, comprising:
    forming a hard mask film and a partition layer over a wafer where a cell region and a peripheral region are defined;
    forming oblique patterns, which are alternately overlapped with rows of cell patterns to be disposed in the cell region, and a reverse pattern of peripheral patterns, which are to be disposed in the peripheral region, over the partition layer;
    attaching spacers to sidewalls of the oblique patterns and the reverse pattern;
    forming first burying patterns between the oblique patterns and a second burying pattern around the reverse pattern by filling gaps between the spacers;
    forming cell patterns by cutting and dividing middle portions of the oblique patterns and the first burying patterns, and setting the peripheral pattern with the second burying pattern by removing the overlapped region on the border region of the oblique patterns and the reverse pattern;
    selectively removing the spacers; and
    forming a hard mask pattern by selectively etching an exposed region of the hard mask film by using the cell patterns and the peripheral pattern as an etching mask.

29. The method of claim 28, wherein the cell patterns are arranged along a 6F$^2$ or 4F$^2$ cell layout.

30. The method of claim 28, wherein the cell patterns are arranged in an oblique direction.

31. The method of claim 28, wherein the forming of the first burying patterns and the second burying pattern comprises:
    burying the oblique patterns, the reverse pattern, and the spacer with a burying layer after the process of attaching the spacers; and
    performing a planarization process on the burying layer to expose top surfaces of the oblique patterns, the reverse pattern, and the spacer.

32. The method of claim 31, wherein the planarization process is performed by a chemical mechanical polishing (CMP) process or an etch-back process.

33. The method of claim 28, further comprising, after forming the hard mask pattern:
    forming a device isolation trench having a first width in the cell region by etching the wafer of the cell region and the peripheral region by using the hard mask pattern as an etching mask; and
    forming another device isolation trench having a second width in the peripheral region, wherein the second width is wider than the first width.

34. The method of claim 28, wherein the forming of the oblique patterns and the peripheral pattern comprises:
    forming a resist film over the partition layer after forming the partition layer;

obtaining a target layout of cell patterns, which form rows in the cell region, and peripheral patterns, which are to be disposed in the peripheral region;

obtaining a reverse layout of a target layout of the cell patterns and the peripheral pattern;

reducing the size of the reverse layout;

transferring the reverse layout onto the resist film; and patterning the partition layer by using the resist film onto which the reverse layout is transferred.

35. The method of claim 34, wherein the size of the reverse layout is reduced by the width of the spacer or by more than the width of the spacer.

36. The method of claim 28, wherein the setting of the cell pattern and the peripheral patterns comprises:

forming a resist film over the first burying patterns and the second burying pattern after the process of forming the first burying patterns and the second burying pattern;

disposing a cutting mask over the resist film, the cutting mask including holes, which expose the middle portions of the oblique patterns and the first burying patterns, a first open portion, which exposes the overlapped region on the border region, and a second open portion, which exposes the reverse pattern;

forming a resist pattern by transferring the holes, the first open portion, and the second open portion of the cutting mask onto the resist film; and selectively etching and removing exposed regions of the resist pattern.

37. The method of claim 36, wherein the first and second open portions of the resist pattern expose an entire region of the reverse pattern, and exposes a half region of the spacer.

* * * * *